(12) United States Patent
Fukutomi et al.

(10) Patent No.: US 6,268,648 B1
(45) Date of Patent: Jul. 31, 2001

(54) BOARD FOR MOUNTING SEMICONDUCTOR ELEMENT, METHOD FOR MANUFACTURING THE SAME, AND SEMICONDUCTOR DEVICE

(75) Inventors: Naoki Fukutomi, Yuki; Yoshiaki Wakashima, Kawasaki; Susumu Naoyuki, Yuki; Akinari Kida, Tochigi-ken, all of (JP)

(73) Assignee: Hitachi Chemical Co., Ltd. (JP)

( * ) Notice: Subject to any disclaimer, the term of this patent is extended or adjusted under 35 U.S.C. 154(b) by 0 days.

(21) Appl. No.: 09/423,062
(22) PCT Filed: Apr. 30, 1998
(86) PCT No.: PCT/JP98/01970
  § 371 Date: Oct. 29, 1999
  § 102(e) Date: Oct. 29, 1999
(87) PCT Pub. No.: WO98/49726
  PCT Pub. Date: Nov. 5, 1998

(30) Foreign Application Priority Data

Apr. 30, 1997 (JP) .................................................. 9-112753
Feb. 6, 1998 (JP) .................................................. 10-25896

(51) Int. Cl.$^7$ .................................................. H01L 29/72
(52) U.S. Cl. .................... 257/678; 257/688; 257/692; 257/698; 257/720; 438/126
(58) Field of Search .............................. 257/678, 688, 257/692, 698, 720; 438/126

(56) References Cited

U.S. PATENT DOCUMENTS 5,574,309 * 11/1996 Papapietro et al. .................. 257/698

FOREIGN PATENT DOCUMENTS

| | | | |
|---|---|---|---|
| 50-147292A | 11/1975 | (JP) | H01L/27/02 |
| 63-198186 | 8/1988 | (JP) | G06M/7/00 |
| 2-095246 U | 7/1990 | (JP) | H01L/23/02 |
| 2-142540 U | 12/1990 | (JP) | H01L/23/12 |
| 3-163861A | 7/1991 | (JP) | H01L/25/00 |
| 3-177055 | 8/1991 | (JP) | H01L/23/12 |
| 4-340750A | 11/1992 | (JP) | H01L/23/12 |
| 6-244304 | 9/1994 | (JP) | H01L/23/12 |
| 7-094628 | 4/1995 | (JP) | H01L/23/12 |

* cited by examiner

*Primary Examiner*—Edward Wojciechowicz
(74) *Attorney, Agent, or Firm*—Pennie & Edmonds LLP

(57) ABSTRACT

A semiconductor device comprising a substrate with a cavity portion for mounting a semiconductor chip is provided to achieve a high reliability and to decrease a size and a fabricating cost. The cavity portion capable of mounting the semiconductor chip (1) at the center portion of the substrate is formed by press forming with a projected portion (13*a*) of a die (13) while adhering a press shapeable wiring body comprising a copper wiring (12) which becomes wiring material, a barrier layer (11) such as nickel alloy or the like, and a copper foil (10) which is a carrier layer, to a plastic substrate (14,15), so as to have wiring (2) buried into a surface of the substrate and to form a ramp between an inner connection terminal portion connecting to the semiconductor chip (1) and an external connection terminal portion connecting to an external connection terminals (5), the internal and external connection terminal portions being two edge portions of the wiring (2).

37 Claims, 15 Drawing Sheets

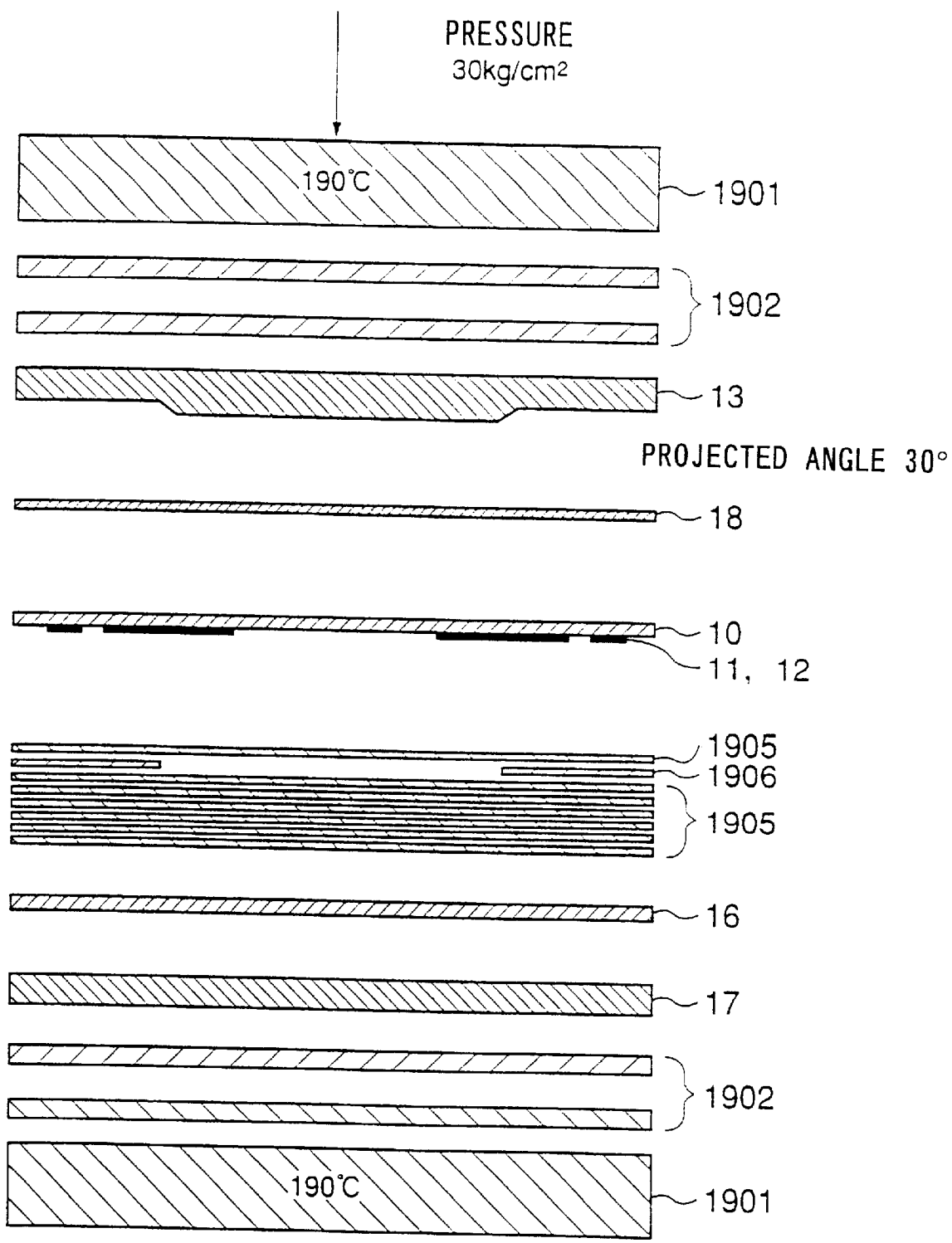

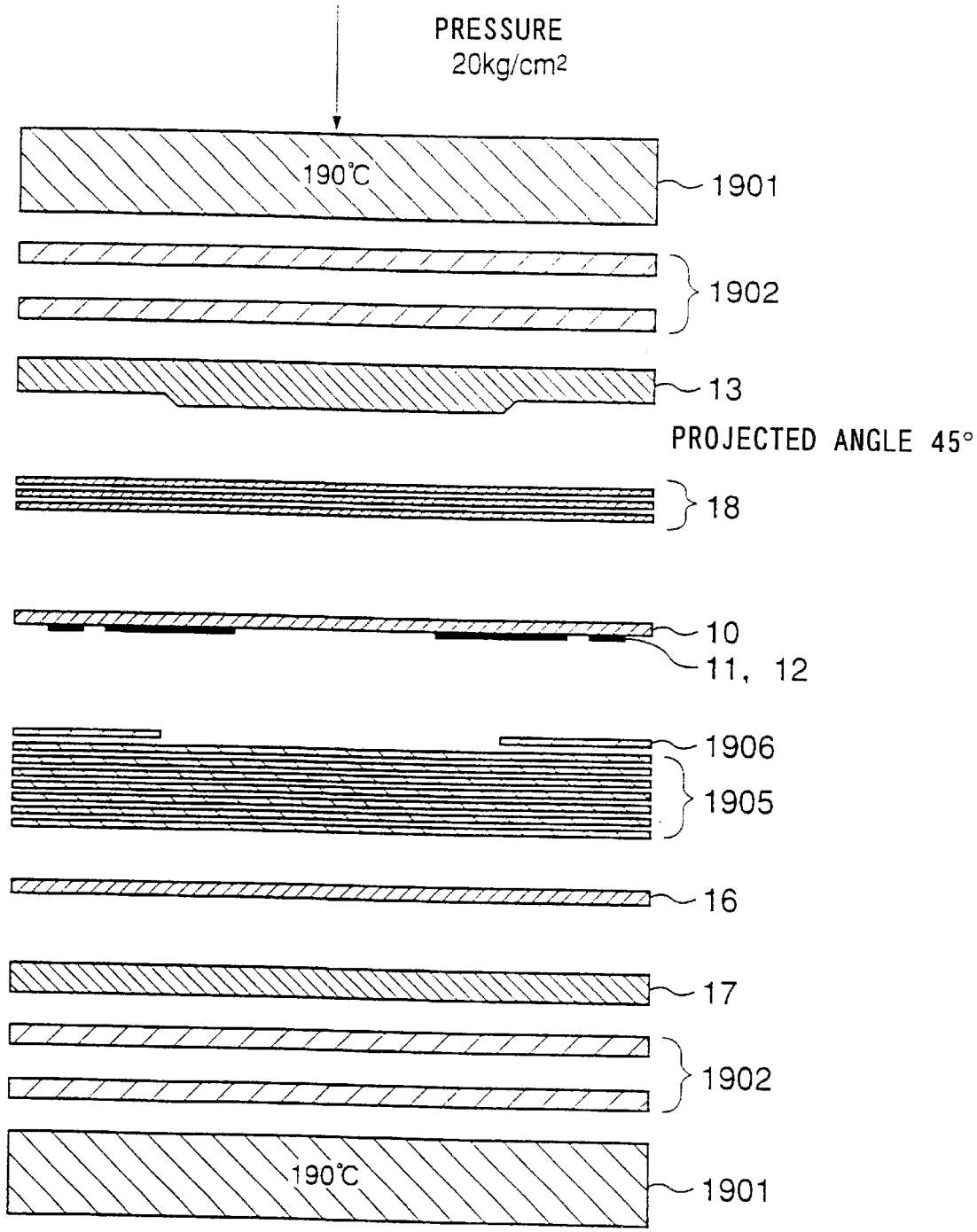

BOARD FOR MOUNTING SEMICONDUCTOR ELEMENT, METHOD FOR MANUFACTURING THE SAME, AND SEMICONDUCTOR DEVICE

TECHNICAL FIELD

This invention is related to a substrate for mounting a semiconductor chip (called semiconductor chip package substrate hereafter), a method of fabricating the semiconductor chip package substrate, and a semiconductor device comprising the semiconductor chip package substrate onto which the semiconductor chip is mounted.

BACKGROUND ART

There is a growing need for a smaller semiconductor device package with multiple terminal pins due to increases of an integration rate and an operation frequency in the recent semiconductor device. However, a package size of a conventional peripheral terminal type utilizing a lead-frame has to be made larger if a number of the terminals should be increased further. One of countermeasures is to decrease a terminal pitch in the package. However, it is difficult to make the terminal pitch narrower than 0.4 mm.

To accommodate such increasing number of the terminals, an area array type package with its terminals disposing over a surface plane is introduced. The area array type package requires to have a wiring substrate for providing wiring from chip terminals to external terminal electrodes. The chip may be mounted either at the upper surface or the lower surface of the wiring substrate when the external terminal electrodes are disposed at the lower surface of the wiring substrate. When the chip is mounted on the upper surface of the wiring substrate, interlayer connections between the upper surface and the lower surface of the wiring substrate have to be provided. When the chip is mounted on the lower surface of the wiring substrate, the interlayer connections will not be required. However, a hollow space has to be provided to absorb total thickness of the chip and its sealing material when the chip is mounted on the lower surface of the wiring substrate.

The hollow space is called a cavity, and a structure with the cavity at the lower surface of the wiring substrate is called a cavity down structure. Typically, the structure can be made by hollowing out a substrate, or by making a hole through the substrate and adhering a base plate thereto. Wiring for a multiple layer structure is required when heights of chip bonding portions and external electrodes are changed because the wiring is also disposed on the same surface in this structure. According to the methods described above, a wiring structure, which satisfies required conditions for a three dimensional spatial relationships among the chip mount portion, the chip bonding portion and the external electrode portion.

One of the area array type semiconductor package is Ball Grid Array (BGA) in which solder balls are used as connection terminals. Cost of the BGA is higher than that of a semiconductor device fabricated with a conventional leadframe, and reduction of the cost is anticipated. The higher cost is due to a fact that a structure and fabricating process of the semiconductor chip package substrate are more complex than that of a substrate with the leadframe. Accordingly, it is anticipated the development of simpler structure and fabricating process of the semiconductor chip package substrate.

The wiring substrate used for the area array type semiconductor package is typically called an interposer. The interposer may be roughly classified into a film type and a rigid type. A number of the wiring layers can be either one, or two, or three and more layers. Generally, the fabricating cost is lower for a fewer number of the wiring layers.

The lowest cost is expected with the single layer wiring structure. If the wiring is disposed at least in both surfaces of the interposer, the semiconductor chip mount portion and the external terminals may be divided at the upper and the lower surfaces. However, the semiconductor chip mount portion and the external terminals are disposed on the same surface of the interposer with the single layer wiring structure. In such a single layer wiring structure, it is required to have the cavity portion on the wiring surface with a depth at least comparable to a thickness of the chip so as to store the chip therein. A method of fabricating such a cavity portion has become an important subject.

In the interposer so called TAB (Tape Automated Bonding) or TCP (Tape Carrier Package) and their packaging technology, the center portion of the interposer is bored through to store the semiconductor chip. With the rigid plate, the center portion of the interposer is similarly bored through to hollow the semiconductor chip store portion out and adhere a metal plate as the base plate thereto, or the cavity portion is fabricated at the center portion of the interposer. The wiring is disposed only in a flat plane portion, not inside the cavity portion.

DISCLOSURE OF INVENTION

The present invention is made by considering the above mentioned subjects. An object of the present invention is to provide a semiconductor chip package substrate for mounting a semiconductor chip(s) and a method of fabricating the semiconductor chip package substrate, and a semiconductor device wherein a semiconductor chip(s) is mounted on the semiconductor chip package substrate, those of which enable to reduce the size, increase the reliability, reduce the cost, and make the standardization of design and fabricating method easier.

The above object of the present invention is accomplished by a semiconductor chip package substrate with a cavity portion, or a semiconductor device fabricated by mounting at least one semiconductor chip in the cavity portion and sealing with plastic sealant, wherein said semiconductor chip package substrate comprises wiring disposed along a surface of the substrate and wall surfaces of the substrate in the cavity portion, the wiring comprises an external connection terminal portion for connecting to external connection terminals which are provided on the surface of the substrate at a side of the cavity portion's opening, an internal connection terminal portion for connecting to the mounted semiconductor chip, and a wiring portion disposed in between the external connection terminal portion and the internal connection terminal portion, the wiring portion is buried in a surface of the substrate and one of said wall surfaces of the substrate in the cavity portion and the internal connection terminal portion is disposed inside of the cavity portion.

For example, the wall surface of the substrate in the cavity portion may be extended toward the bottom surface of the cavity portion with a slant angle which is set within a predetermined angle range. Concretely, the slant angle may be within a range of 5–40°, and preferably within a range of 10–40°. The slant structure may be fabricated so as that a ratio L/G is within a range of 1.5<L/G<10, where G is a height of the slant structure of the wall surface of the substrate in the cavity portion, and L is its horizontal dimension. More preferable range of the ratio L/G is 2<L/G<10, and the most preferable range is 3<L/G<10.

The cavity portion is, for example, formed by a press forming process utilizing a press pattern with a projected portion. The cavity portion may also be formed into a multiple step structure.

Alternatively, the cavity portion may be provided with a semiconductor chip mount portion for mounting semiconductor chip, which is formed by hollowing the cavity portion out further. A depth of the semiconductor chip mount portion which has been hollowed out is preferably larger than a thickness of a semiconductor chip to be mounted therein.

Furthermore, a height of a ramp between the external connection terminal portion disposed on the substrate surface and the internal connection terminal portion disposed inside of the cavity portion may be preferably not less than 0.05 mm in the semiconductor chip package substrate and the semiconductor device according to the present invention.

The terminals of the semiconductor chip mounted inside of the cavity portion and the internal connection terminal portions are wire-bonded, or, directly connected by a face-down bonding.

Furthermore, the wiring in the semiconductor chip package substrate and the semiconductor device according to the present invention may be preferably disposed in an area of the wall surface which does not include any of corner sections of the cavity portion.

Furthermore, the cavity portion may be formed substantially at the center of the major surface plane of the substrate, and the semiconductor chip may be mounted inside of the cavity portion so as the semiconductor chip to be positioned substantially at the center of a dimension of the thickness of the semiconductor chip package substrate. Alternatively, the semiconductor chip may be offset-mounted in the cavity portion with an offset amount of not bigger than 30% of the substrate thickness from the center position of the substrate's thickness along a direction of the thickness. The cavity portion may have a size large enough to mount a plurality of device elements on its bottom surface area, and may be provided with a plurality of wiring sets to the plurality of device elements, and a plurality of semiconductor chips and passive device elements may be mounted in the cavity portion.

Furthermore, the wiring in the semiconductor chip package substrate and the semiconductor device according to the present invention is preferably formed by utilizing a squeeze shapeable wiring construction body consisting of only metals, the squeeze shapeable wiring construction body having a multiple layer structure including at least the first metal layer for constructing the wiring and the second metal layer which functions as a carrier layer.

Furthermore, a depth of the cavity portion may be less than a thickness of the semiconductor chip to be mounted, and the cavity portion may be hollowed out at the bottom surface of the cavity portion from the center portion along a direction of a thickness of the semiconductor chip package substrate up to a depth within a range of 0.5–2.5 times a thickness of the semiconductor chip to be mounted. Alternatively, a depth of the cavity portion may be less than a thickness of the semiconductor chip to be mounted, and the cavity portion may be hollowed out at the bottom surface of the cavity portion, and the semiconductor chip package substrate may be further comprising a plastic layer formed by hardening prepregs so as to have an exposed hollowed-out bottom surface at least consisting of nonwoven fabrics.

In this case, a metal plate with a thickness of not less than 0.035 mm may be adhered to a reverse side of the plastic layer wherein the cavity portion was formed, a depth of the cavity portion may be made to be less than a thickness of the semiconductor chip to be mounted, and the bottom of the cavity portion may be hollowed out to expose the metal plate. Alternatively, a metal plate with a thickness of not less than 0.20 mm may be adhered to the reverse side of the plastic layer wherein the cavity portion was formed, a depth of the cavity portion may be made to be less than a thickness of the semiconductor chip to be mounted, and the bottom of the cavity portion may be hollowed out into the metal plate as much as the hollowed out depth in the metal plate is not less than 0.05 mm.

Furthermore, the hollow-out process of the plastic layer may be stopped before reaching the metal plate.

The above object of the present invention may be accomplished by a fabricating method of a semiconductor chip package substrate, comprising the steps of: pressing to adhere a squeeze shapeable wiring construction body to a plastic substrate, the wiring construction body consisting of all metals and having a multiple layer structure comprising at least the first metal layer and the second metal layer which functions as a carrier layer; coincidentally shaping the plastic substrate so as to form a cavity portion therein with its wall surfaces having inclination angles within a predetermined range; and removing the metal layers except the first layer; wherein the wiring, which is buried in the substrate surface and wall surface of the substrate in the cavity portion, is formed and disposed along the substrate surface and the wall surface of the substrate in the cavity portion; and the wiring comprising an external connection terminal portion for connecting to external connection terminals disposed on a surface of the substrate on a side of the cavity opening, an inner connection terminal portion for connecting to a semiconductor chip to be mounted, and a wiring portion in between the external connection terminal portion and the inner connection terminal portion.

A percentage elongation after fracture of the squeeze shapeable wiring construction body is preferred to be not less than 2%. A thickness of the carrier layer composing the squeeze shapeable wiring construction body is preferred to be within a range of 0.010–0.050 mm. A slant angle range of the wall surface of the substrate in the cavity portion is preferred to be from 50 to 400, and a depth of the cavity portion is preferred to be at least not less than 30% of a thickness of a semiconductor chip to be mounted. The hollow-out process may be performed on the bottom surface of the cavity portion after the cavity portion is formed, and after the hollow-out process, other metal layers may be removed. Performing the hollow-out process while having the other metal layers enable to increase a process accuracy at hollowed out edges.

The above object of the present invention may be accomplished by a fabricating method of a semiconductor chip package substrate having at least one cavity portion for mounting at least one semiconductor chip and wiring, comprising the steps of: a step for making a depth of the cavity portion less than a thickness of a semiconductor chip to be mounted, and a step for hollowing out the cavity portion at the bottom surface, wherein the wiring to the semiconductor chip mounted is cut during the hollow-out process, and the cut edge portion of the wiring reaches a fringe portion of a cavity portion formed by the hollow-out process. A process accuracy at edges of the cavity portion increase.

According to the present invention, a fine pitch wiring corresponding to a connection pitch of the semiconductor chip may be disposed while forming the cavity portion which is capable of mounting the semiconductor chip, and is suitable for an area array type semiconductor package. The semiconductor package utilizing this technology is suitable for CSP (Chip Scale Package), FBGA (Fine Pitch Ball Grid Array), BGA (Ball Grid Array), LGA (Land Grid Array) or the like.

BRIEF DESCRIPTION OF THE DRAWINGS

FIG. 19 is a cross sectional view showing other example of the fabricating method (press configuration) of the semiconductor device according to the present invention;

FIG. 20 is a cross sectional view showing other example of the fabricating method (press configuration) of the semiconductor device according to the present invention;

BEST MODE FOR CARRYING OUT THE INVENTION

Figure 1:
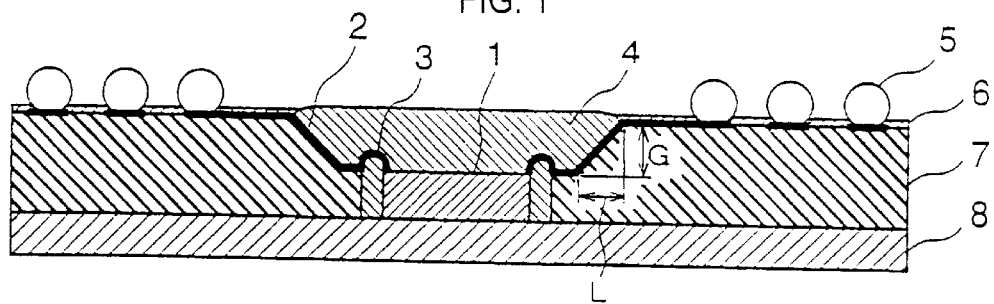
FIG. 1 is a cross sectional view showing an example of a cross sectional structure of a semiconductor package according to the present invention.

An embodiment of an semiconductor device according to the present invention will now be explained with reference to FIGS. 1–4. However, the present invention is not only limited to the following embodiment.

As shown in the figures, the semiconductor device in the present embodiment comprises a semiconductor die (semiconductor chip) 1, an insulation substrate 7 with a cavity portion or a through hole portion to mount the semiconductor chip 1, external electrodes 5 which are disposed on a surface plane of the insulation substrate 7 to establish electrical connections to the semiconductor chip 1 and outside of the device when the device is packaged, and plastic sealant 4 for sealing the cavity portion or the through hole portion after the semiconductor chip 1 is mounted therein.

The semiconductor device of the present embodiment further comprises wiring 2 for electrically connecting the semiconductor chip 1 and the external electrodes 5. The wiring 2 comprises an inner connection terminal portion connected to wire 3 for connecting the semiconductor chip 1, an external terminal portion connected to the external electrode 5, and a wiring portion disposed between the inner connection terminal portion and the external connection terminal portion. A ramp is formed between the inner connection terminal portion and the external connection terminal portion of the semiconductor device.

The wiring 2 connecting the wires 3 and the external electrodes 5 is buried continuously into a surface layer of the substrate surface portion where the external electrodes are disposed, and to a surface layer of the cavity portion wall or its bottom plane. The semiconductor chip 1, the wires 3, the connection portion between the wires 3 and the wiring 2 (the inner connection terminal portion), and major parts or all parts of the wiring 2 are disposed inside the cavity portion and sealed by the plastic sealant 4.

Figure 2:
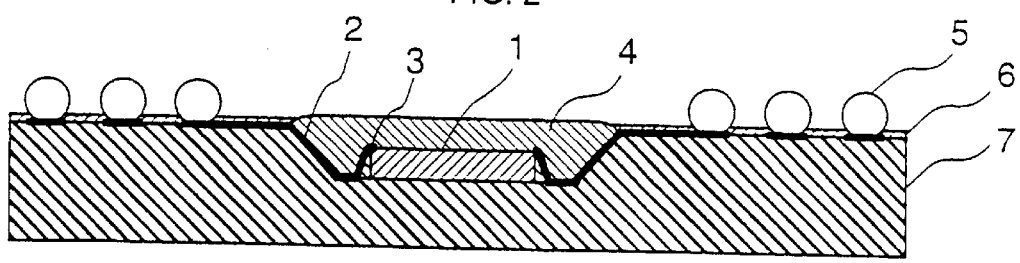
FIG. 2 is a cross sectional view showing other example of the cross sectional structure of the semiconductor package according to the present invention.
Figure 3:
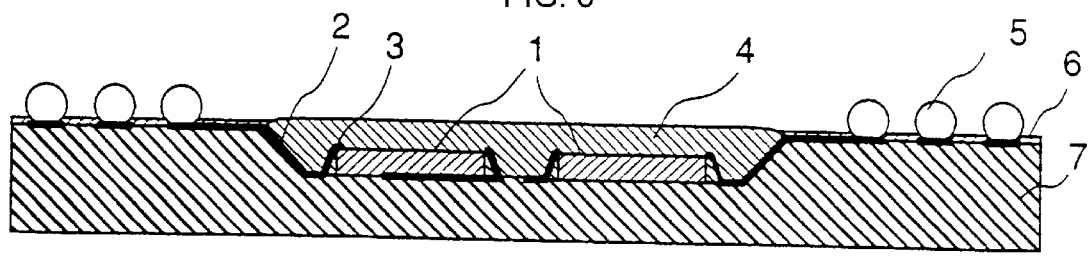
FIG. 3 is a cross sectional view showing an example of a cross sectional structure of the semiconductor package according to the present invention, in which a plurality of semiconductor chips are mounted.
Figure 4:
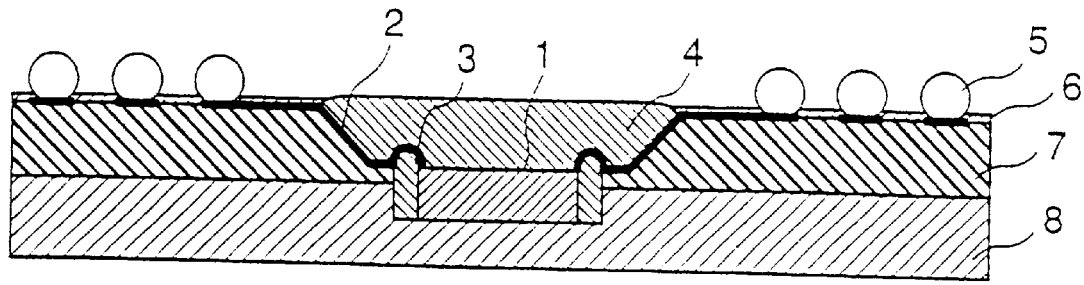
FIG. 4 is a cross sectional view showing an example of a cross sectional structure of the semiconductor package according to the present invention, having an efficient heat dissipation function.

Numeral 6 in FIGS. 1–4 indicates a surface insulation layer formed on a surface of the insulation substrate 7, and numeral 8 in FIGS. 1 and 4 indicates a metal plate disposed on the bottom surface side of the insulation layer 7.

The semiconductor device and the semiconductor chip package substrate are fabricated by pressing to adhere a squeeze shapeable wiring construction body to a plastic substrate, the wiring construction body consisting of all metals and having a multiple layer structure comprising at least the first metal layer and the second metal layer which functions as a carrier layer, coincidentally shaping the plastic substrate so as to form a cavity portion therein with its wall surfaces having inclination angles within a predetermined range, removing the metal layers except the first layer, so as to form wiring, which is buried in the substrate surface and wall surface of the substrate in the cavity portion, and disposing the wiring along the substrate surface and the wall surface of the substrate in the cavity portion, wherein the wiring comprises an external connection terminal portion for providing a connection to an external connection terminal disposed on a surface of the substrate on a side of the cavity opening, an inner connection terminal portion for providing a connection to the mounted semiconductor chip, and a wiring portion between the external connection terminal portion and the inner connection terminal portion.

When the squeeze shapeable wiring construction body is pressed and adhered to the plastic substrate, and all the metal layers except the first layer are removed, three surfaces of the first metal layer, i.e. the wiring, which were not faced to the other metal layer, are buried into the plastic substrate, and the surface which had been faced to the other metal layer is exposed at a plane coinciding a surface plane of the plastic substrate. It is assumed that the burying of the wiring is carried out in such a way described above in the present invention.

With the wiring construction body which may be squeeze-shaped, a width (a) of a wiring surface of the wiring (the first metal layer) faced to the other metal layer is larger than a width (b) of a wiring surface opposite to the wiring surface (a). In the present invention, the larger width wiring surface (a) is exposed, and this surface may be used as a terminal. Accordingly, it is possible to increase a wiring density per unit area so as to realize a higher density package.

The squeeze shapeable wiring construction body may have a multiple layer structure at least comprising the first metal layer functioning as the wiring and the second metal layer functioning as its carrier layer, or may comprise the first metal layer functioning as the wiring, which is formed from a metal foil by carrying out a half etching process using a predetermined resist pattern from a side of the metal foil, and the second metal layer functioning as its carrier layer.

When the squeeze shapeable wiring construction body is pressed and adhered to the plastic substrate, and the other metal layers except the first metal layer are removed, parts of the other metal layers may be left to form the inner connection terminal portions, the external connection terminal portions or the like, for example.

The cavity portion is press formed with a mating projected die. The semiconductor mount portion for mounting the semiconductor chip 1 is embodied by the cavity portion itself or by hollowing the cavity portion out further. There, the cavity portion may be formed from a plurality of cavities.

A depth of the semiconductor chip mount portion formed from the cavity portion itself or by further hollowing the cavity portion out may preferably be larger than a thickness of the semiconductor chip 1 to be mounted.

If the cavity portion should be hollowed out further, the other metal layer (the carrier layer) may be removed after the hollowing-out process.

A slant angle of a slant portion wherein the wiring 2 is disposed in the present embodiment may be set to a value within a predetermined angle range which is set in correspondence with fabricating conditions in the fabricating method of the semiconductor device described in detail hereafter.

Concretely, the slant angle of the wall surface of the cavity portion may be set to a value within a range between 5 and 40 degrees. More preferably, the value may be set within a range between 5 and 25 degrees, and further preferably the value may be set within a range between 5 and 18 degrees. The slant angle may be determined according to not only a shape of the die used for the press forming but also physical characteristics of the wiring construction body (transfer metal foil) which may be squeeze-shaped and used for fabricating the wiring 2, or fabricating conditions during the cavity portion press forming, or the like. The slant angle here means the maximum slant angle.

The slant portion may also be characterized by a height of the slant portion G and a horizontal length L (see FIG. 1). As to the slant portion of the semiconductor device of the present embodiment, a ratio L/G may be set within a range $1.5<L/G<10$. More preferably the ratio L/G may be set within a range $2<L/G<10$, and the most preferably $3<L/G<10$.

Furthermore, a height of the ramp is preferably 30% of a thickness of the semiconductor chip 1 to be mounted. Typically, the thickness of the semiconductor chip 1 is in a range between 0.2 and 0.5 mm. Accordingly, the ramp height should be at least in a range between 0.06 and 0.15 mm.

The ramp height may be varied in accordance with a height of the external electrodes 5. When solder balls are used as the external electrodes 5 as shown in FIGS. 1–4, a margin in the ramp height may be varied in accordance with a size of the solder ball. For example, if a diameter of the solder ball is about 0.7 mm, the sufficient distance between the package and the mother board may be accommodated with utilizing a low profile wire bonding process and keeping a height of the plastic sealant 4 to less than about 0.2 mm. It will be difficult to provide the sufficient distance between the package and the mother board without the cavity portion if the diameter of the solder ball is less than 0.4 mm.

Furthermore, it is necessary to dispose a wire bonding connection portion inside the cavity portion for LGA (Land Grid Array) without using the solder balls.

Corner portions are the most easily breakable part when the ramp of a square or rectangular shape is fabricated in the insulation substrate 7 for mounting the semiconductor chip 1. The corner portions may be largely deformed even if it were not broken. Accordingly, it is preferable not to have the wiring at the corner portion since it may cause some troubles in a long term and lower the reliability if the wiring is disposed in the corner section. If the wiring should be disposed in the corner section, it may be preferable to make the corner section round.

Furthermore, the semiconductor chip 1 may be mounted in the cavity portion of the insulation substrate 7 in such a way that the mounted semiconductor chip 1 is positioned at the center portion of the substrate in a direction along its thickness. Accordingly, a warp of the semiconductor device when heat cycles are applied may be controlled under a smaller value.

When the semiconductor chip is offset mounted from the center portion, a substantial reliability, which is related to a rigidity of the substrate and an amount of cure shrinkage of the plastic sealant, may be ensured up to an offset amount of 30% of the substrate thickness.

The mount portion for mounting the semiconductor chip 1 may be formed not only by the press forming of the cavity portion but also by hollowing out an additional cavity inside the cavity portion as shown in FIGS. 1 and 4 so as to fabricate various types of the semiconductor chip package substrates. The hollow out process is widely used in a print wiring board industry. An end mill device may be used to conduct the hollow out process mechanically while controlling machining dimensions precisely in XYZ directions.

In the present embodiment, a depth of the hollowed out cavity is required to be set within a range between 0.5 times and 2.5 times the thickness of the chip to be mounted. This is related to how easily the wire bonding connection can be fabricated. In a low loop wire bonding with a lower profile, it is preferred to have less height difference between a chip side bonding location and a substrate side bonding location.

A surface condition of the hollowed out plane affects the adherence nature with the semiconductor chip 1 and with the plastic sealant 4. When the substrate 7 for mounting the semiconductor chip 1 is fabricated from continuous glass fiber of a fabric type, the glass fiber and the plastics may be detached at the hollowed out plane. A wettability with the plastic sealant or die bonding plastic is low at the hollowed out plane, and the adhesive force is weaker in such a case. When nonwoven fabric is used, the hollowed out plane becomes smooth since the nonwoven fabric is composed of short glass fibers. Accordingly, the wettability with the plastic sealant or die bonding plastic is high at the hollowed out plane, and thus the adhesive force is stronger. The fabricating method will be described in detail in the following.

Furthermore, the substrate may be fabricated by forming the wiring and a cavity portion at the center portion of the insulator substrate 7 with an insufficient depth for mounting the semiconductor chip, hollowing out the cavity portion further, and cutting a part of the wiring 2 during the hollow out process so as that the end portion of the wiring 2 may reaches the brink of the cavity portion formed by the hollow-out process.

Furthermore, as shown in FIG. 3, the substrate may be fabricated by forming the wiring 2 and a cavity portion, wherein a plurality of components may be mounted, at the center portion of the insulator substrate 7 so as to mount a plurality of semiconductor chips and/or passive elements in the cavity portion. The wiring 2 may be used for wiring between the semiconductor chips within the cavity portion, and between inside and outside of the cavity portion.

Furthermore, a metal portion which can be functioned as a heat dissipation layer or the like may be simultaneously integrated into one body when a metal plate is placed at the bottom side during the press forming of the cavity portion.

Furthermore, as shown in FIG. 4, the substrate may be fabricated by hollowing out the insulator substrate 7 with the metal plate 8 attached to the bottom side so as to expose a metal surface at the bottom plane of the cavity portion. It is necessary to cut into the metal plane when the end mill is used in the hollow out process to expose the metal layer surface. Accordingly, the metal plate 8 is required to have an sufficient thickness. If a thin metal plate should be used, it will be difficult to make a substantial compensation with an order of precession comparable to a thickness of the plate during the end mill machining. However, it will be possible to fabricate such a substrate by utilizing a laser beam machining or plasma machining or plastic etching, or utilizing these process with the end mill machining. Alternatively, the substrate may be fabricated by hollowing through the substrate at a portion need to be hollowed out and adhering another substrate or a metal plate.

Methods of fabricating the semiconductor device in the present embodiment will now be explained with reference to FIGS. 5–8.

The first example will now be described.

Figure 5:
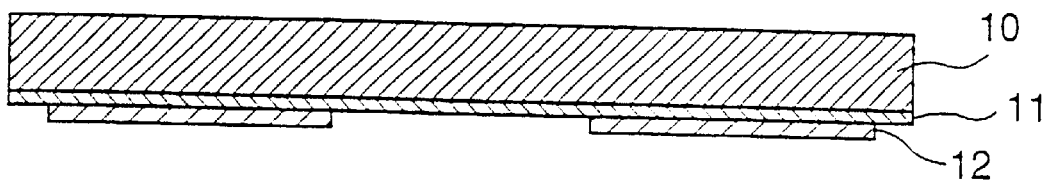
FIG. 5 is a cross sectional view showing an example of a cross sectional structure of a wiring construction body which is composed of all metals and can be squeeze-shaped.
Figure 6:
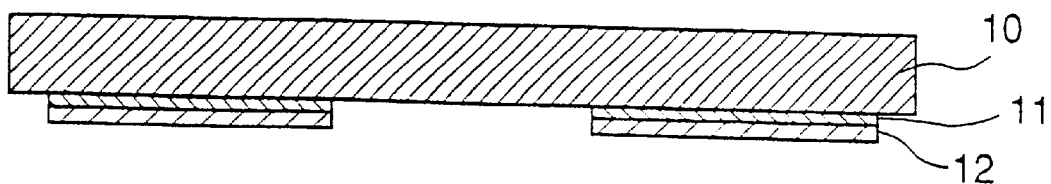
FIG. 6 is a cross sectional view showing other example of the cross sectional structure of the wiring construction body which is composed of all metals and can be squeeze-shaped.

In the instant example of the fabricating method, a three layer structure foil is utilized as a transfer metal foil for fabricating wiring which may comprise the wiring 2 as shown in FIG. 5 or FIG. 6 for example. The three layer structure foil is formed by plating a 0.5 $\mu$m thick nickel layer 11 over a 35 $\mu$m copper foil 10 (carrier foil) and further forming a 5 $\mu$m copper layer 12 thereon. This copper foil is fabricated by NIHON DENKAI Co.

The transfer metal foils having structures other than the instant example may be also used in the present invention as long as it comprises from all metal substances and includes no plastic. Namely, the transfer metal foil is preferred to have at least a carrier layer (the copper foil 10 in the instant example) and a wiring layer (the copper layer 12 in the instant example). When the same type of metal is used for the carrier layer and the wiring layer, a barrier layer (the nickel alloy 11 in the instant example) comprising the different type of metal should be provided between the layers. The carrier layer will be removed by etching in later process. A part of the carrier layer may be left unremoved so as to utilize the remaining part of the carrier layer as terminals.

The transfer metal foil is required to have a percentage elongation after fracture of not less than 2% (and preferably not more than 100%) within a process temperature range (press temperatures of 150–250° C.). A thickness of the carrier layer of the transfer metal foil should be within a range between 0.010–0.050 mm. Handling of the transfer metal foil may become difficult if the carrier layer is thinner than the above range, and shaping in accordance with the die may become difficult if the carrier layer is thicker than the above range. A surface of the carrier layer, a side of which the wiring layer is not formed, may be etched over the whole surface area to make the carrier layer thinner just before the press shaping of the transfer process.

In the instant example, the copper layer 12 with 5 $\mu$m thickness is employed as the wiring material, and is etched after forming a resist pattern with a conventional photoresist method. The etching solution is needed to have a selectivity for etching only copper and not nickel. Alkali etchants which are widely used in the print board industry are preferred as the etching solution. The carrier layer with 35 $\mu$m thickness is protected by the resist from being etched.

Figure 7:
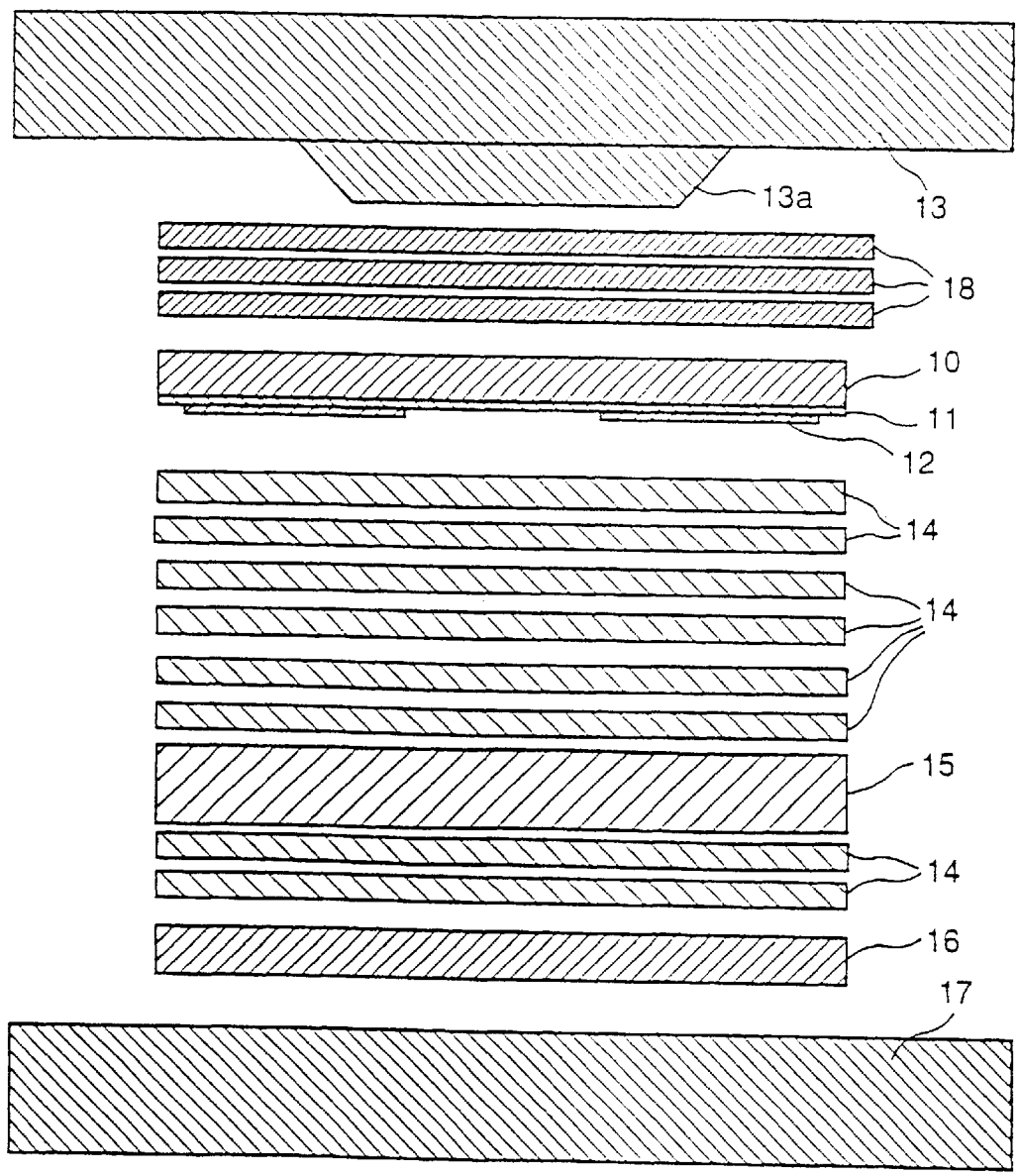
FIG. 7 is an explanatory view illustrating an example of material compositions for press shaping wherein nonwoven fabric prepregs are included in the material composition.

The patterned copper foils 10–12 are heat pressed in an arrangement shown in FIG. 7 for two hours at a temperature of 180° C. and a pressure of 25 kg/cm$^2$. FIG. 7 illustrates the arrangement between the press shaping upper die 13 and the press shaping lower die 17, where a plurality of aluminum foils 18, the patterned copper foil with the three layer structure (copper foil 10, nickel alloy 11, copper wiring 12), a plurality of glass fabric prepregs 14, nonwoven prepreg 15, the glass fabric prepreg 14 and the copper foil 16 functioned as the metal plate are arrayed from top to bottom of the figure.

A cross sectional shape of a projected part 13a of the press shaping upper die 13 is trapezoidal, and its height is 0.15 mm and a slant angle of its side surfaces is 45°. Three aluminum foils 18, each with a thickness of 25 $\mu$m, are placed in between the die and the copper foil 16 so as to provide a cushion layer during the press shaping process.

The prepregs, which are fabricated by Hitachi Chemical Co., Ltd. by impregnating heat resist epoxy into glass fabric or the like, are used.

In the instant example, eight pieces of the glass fabric prepregs 14 each with 0.1 mm thickness are used in total. Furthermore, a piece of the glass fiber nonwoven prepreg 15 with 0.2 mm thickness is used. The nonwoven prepreg is placed between the sixth and seventh piece of the glass fabric prepregs. A glass epoxy substrate fabricated under the conditions described above contains a plurality of device units, each comprising the same wiring and the same cavity portion. The carrier copper foil 10 of the glass epoxy substrate is etched by the alkali etchant described above to remove the carrier copper foil 10 from the whole surface area, and then the nickel layer 11 is etched away by an etching solution for selectively etching nickel.

According to the above mentioned conditions, the cavity portions each with 0.15 mm depth are formed in the substrate with 1.0 mm thickness, and the continuous wiring is disposed at the surface layers including surfaces of the cavity portions. The cavity portions of the substrate are further milled to a depth of 0.55 mm by the end milling machine for adjusting the depth so as to be able to mount the semiconductor chips. Solder resist layers are formed using a conventional method, and 5 $\mu$m thickness of nickel and 0.5 $\mu$m thickness of gold are plated at the terminal portions.

The semiconductor chips 1 of 0.28 mm thickness are adhered in the cavity portions, and connected by the wire bonding. The semiconductor chip 1 and the wire bonding portion (wire 3 and the inner connection terminal portion of the wiring 2) are sealed by the plastic sealant 4. After the solder balls 5 are attached, the substrate is diced and separated by the unit to complete the fabrication of the semiconductor device.

According to the fabricating method described above, the structure shown in FIG. 1 may be obtained, for example. Such a construction enables to fabricate a comparatively smaller package which is closer to the chip size, the chip scale package.

The second example will now be described.

The three layer structure foil, formed by plating a 0.5 $\mu$m thick nickel layer over a 35 $\mu$m copper foil (carrier foil) and further forming a 5 $\mu$m copper layer, is also used in the instant example of the fabricating method. The copper foil is made by NIHON DENKAI Co.

The copper layer with 5 $\mu$m thickness is etched after forming a resist pattern with a conventional photo-resist method. The etching solution is needed to have a selectivity for etching only copper and not nickel. Alkali etchants which are widely used in the print board industry are preferred. The carrier layer with 35 $\mu$m thickness is protected by the resist from being etched.

Figure 8:
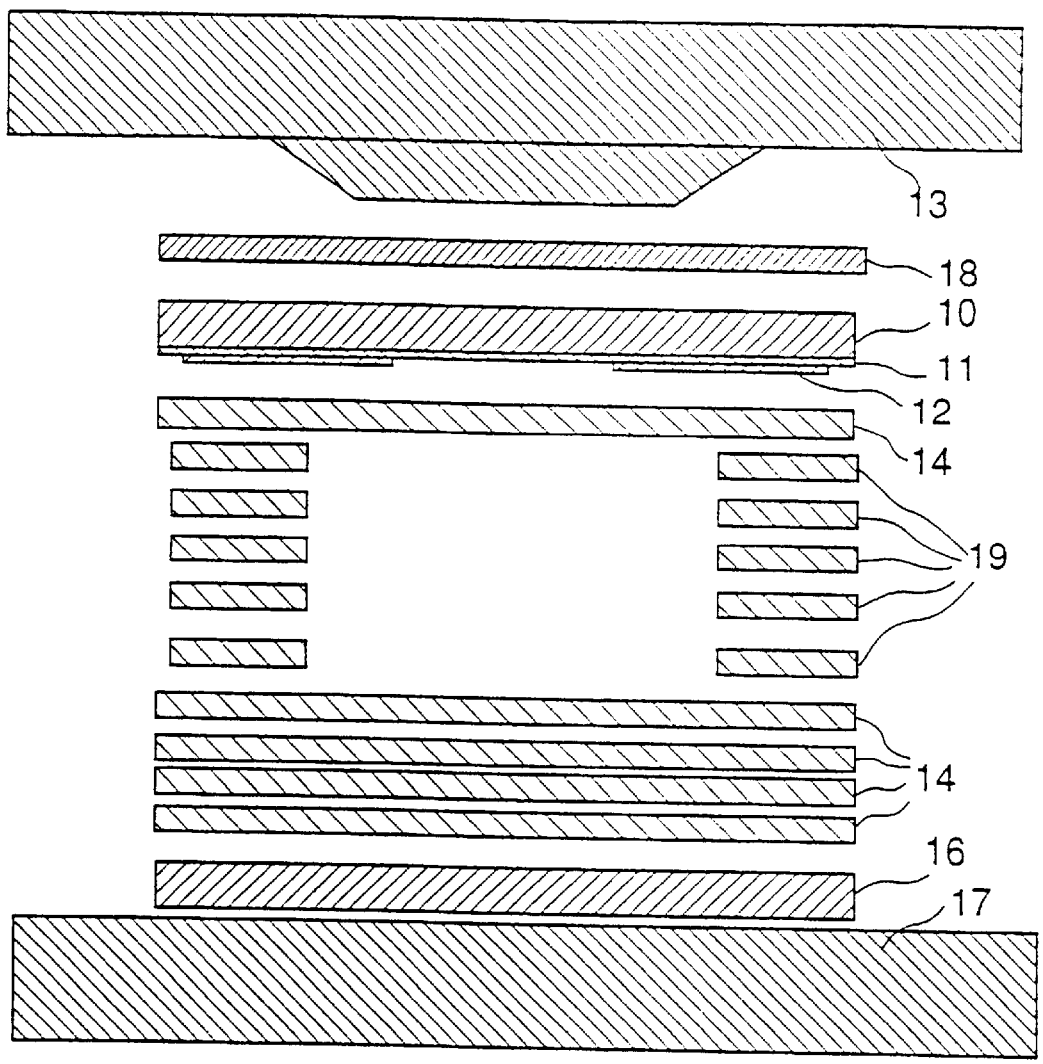
FIG. 8 is an explanatory view illustrating an example of material compositions for press shaping wherein bored through prepregs are included in the material composition.

The patterned copper foils comprising the copper foil 10, the nickel alloy 11 and the copper layer 12 are heat pressed in the arrangement shown in FIG. 8 for two hours at a temperature of 180° C. and a pressure of 25 kg/cm$^2$. FIG. 8 illustrates the arrangement between the press shaping upper die 13 and the press shaping lower die 17, where an aluminum foil 18, the patterned copper foils in the three layer structure (copper foil 10, nickel alloy 11, copper wiring 12), a glass fabric prepreg 14, a plurality of prepregs 19 having hollowed through portions, a plurality of glass fabric prepregs 14, and the copper foil 16 functioning as the metal plate are arrayed from top to bottom of the figure.

A height of a projected part of the press shaping upper die 13 is 0.5 mm and a slant angle of its side walls is 30°. A piece of the aluminum foil with a thickness of 25 $\mu$m is placed in between the die and the copper foil so as to provide a cushion layer during the press shaping process.

The prepregs fabricated by Hitachi Chemical Co., Ltd. by impregnating heat resist epoxy into glass fabric or the like are used. The prepregs are hollowed out at positions corresponding to the projected portions of the upper die 13. These hollowed-out prepregs are piled so many layers as to make the total thickness of the hollowed-out prepregs comparable to the height of the projected portion. In the instant example, five pieces of the hollowed-out prepregs with 0.1 mm thickness and five pieces of the prepregs without a hole are used for the projected portion of 0.5 mm height.

The glass epoxy substrate fabricated by the conditions described contains a plurality of device units, each comprising the same wiring and the same cavity portion. The carrier copper foil 10 of the glass epoxy substrate is etched by the alkali etchant described to remove the carrier copper foil 10 from the whole surface area, and then the nickel layer 11 is etched away with an etching solution for selectively etching nickel.

According to the above mentioned conditions, cavity portions of 0.5 mm depth are formed on the substrate of 1 mm thickness, and the continuous wiring is buried at the surface layer including surface planes in the cavity portions. Solder resist layers are formed using a conventional method, and layers of a 5 $\mu$m thick nickel and a 0.5 $\mu$m thick gold are plated at the terminal portions. The semiconductor chips 1 are adhered in the cavity portions, and connected by the wire bonding. The chip and the wire bonding portion are sealed by the plastic sealant 4. After the solder balls 5 are attached, the substrate is diced and separated by the device unit to complete the fabrication of the semiconductor device.

According to the fabricating method described above, the structure in which the metal plate is attached at the bottom side of the substrate as shown in FIG. 2 or 3, may be embodied, for example. Such a structure enables to decrease the fabricating cost since no hollow out process is required though the package size becomes larger. This is due to longer slant portions with less slant angle. Furthermore, there is a merit of being able to mounting a plurality of the chips and simultaneously form the wiring between the chips, as shown in FIG. 3.

The third example will now be described.

The three layer structure foil, formed by plating a 0.5 $\mu$m thick nickel layer over a 35 $\mu$m copper foil (carrier foil) and further forming a 5 $\mu$m copper layer, is used in the instant example of the fabricating method. The copper foil is fabricated by NIHON DENKAI Co.

The copper layer with 5 $\mu$m thickness is etched after forming a resist pattern with a conventional photo-resist method. The etching solution is required to have a selectivity for etching only copper and not nickel. Alkali etchants which are widely used in the print board industry are preferred. The carrier layer with 35 $\mu$m thickness is protected by the resist from being etched.

Figure 9:
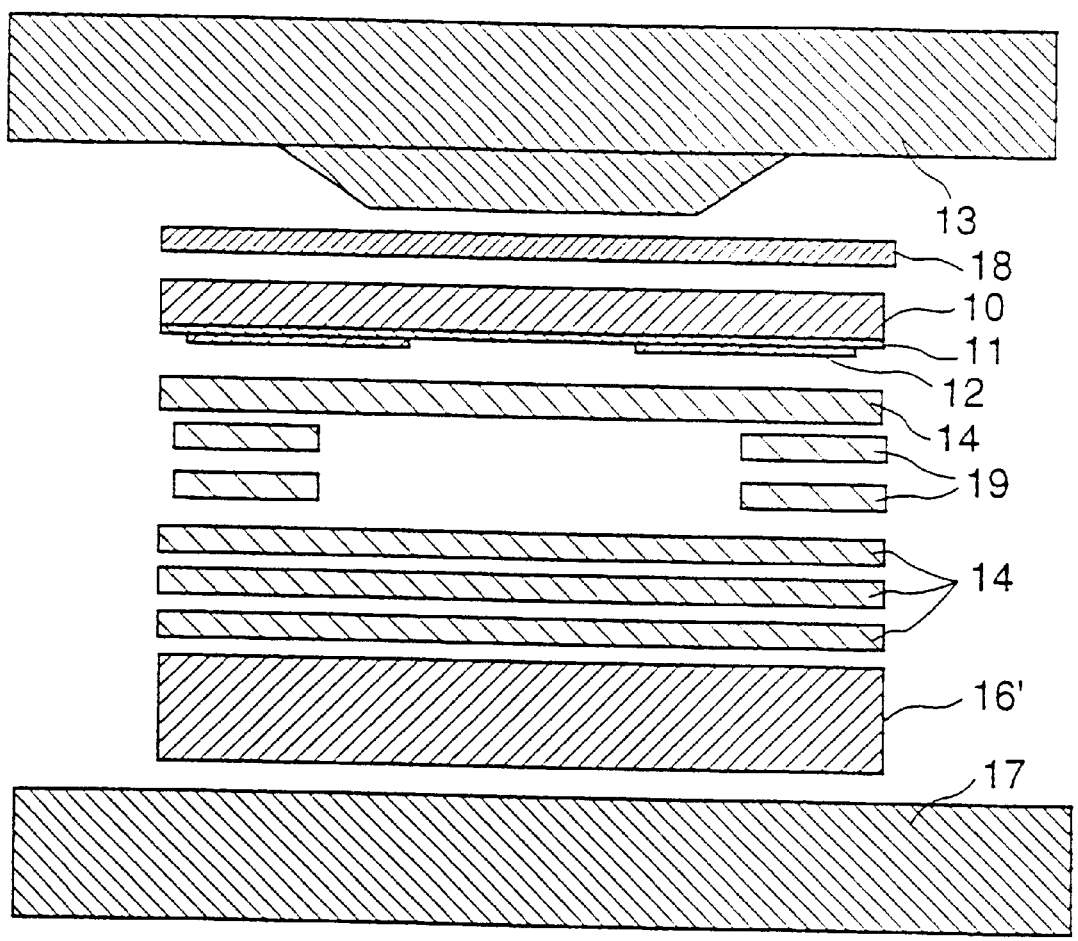
FIG. 9 is an explanatory view illustrating an example of material compositions for press shaping to fabricate an efficient heat dissipation type with a metal plate adhered to the back surface.

The patterned copper foils are heat pressed in the arrangement shown in FIG. 9 for two hours at a temperature of 180° C. and a pressure of 25 kg/cm$^2$. FIG. 9 illustrates the arrangement between the press shaping upper die 13 and the press shaping lower die 17, in which an aluminum foil 18, the patterned copper foils with the three layer structure (copper foil 10, nickel alloy 11, copper wiring 12), a plurality of glass fabric prepregs 14, 19, and a copper plate 16' as the metal plate are arrayed from top to bottom of the figure.

A height of a projected part of the die is 0.20 mm and a slant angle of its side walls is 30°. A piece of the aluminum foil 18 with a thickness of 25 μm is placed in between the die and the copper foil to provide a cushion layer during the press shaping process.

Six pieces of the prepregs, which is fabricated by Hitachi Chemical Co., Ltd. by impregnating heat resist epoxy into glass fabric or the like, with a thickness of 0.1 mm are used. The second and third prepregs 19 are hollowed out at positions corresponding to the projected portions of the upper die 13. Furthermore, the copper plate of 0.40 mm thickness, to which an adhesion roughing process is carried out, is disposed in the bottom side of the substrate, and the press forming process is executed. The total thickness after the press forming process is 1.0 mm.

The glass epoxy substrate fabricated by the conditions described above comprises a plurality of device units each comprising the same wiring and the same cavity portion. The carrier copper foil 10 of the glass epoxy substrate is etched by the alkali etchant described above to remove the carrier copper foil from the whole surface area, and then the nickel layer is etched away by an etching solution for selectively etching nickel.

According to the above mentioned conditions, the cavity portions of 0.20 mm depth are formed in the substrate with 1 mm thickness, and the continuous wiring is disposed at the surface layer including surface planes of the cavity portions. The substrate is milled further by an end milling machine up to 0.65 mm depth for mounting semiconductor chips. Solder resist layers are formed using a conventional method, and layers of 5 μm thickness of nickel and 0.5 μm thickness of gold are plated at the terminal portions.

The semiconductor chips 1 are adhered in the cavity portions, and connected by the wire bonding. The chip and the wire bonding portion are sealed by the plastic sealant 4. After the solder balls 5 are attached, the substrate is diced and separated by the device unit to complete the fabrication of the semiconductor device.

According to the fabricating method described above, the structure shown in FIG. 4 may be obtained, for example. Such a structure enables to decrease the fabricating cost and attain high reliability since the heat dissipation plate may be attached to the substrate during the same press forming process.

According to the first to third examples, it is possible to provide a semiconductor chip package substrate for mounting a semiconductor chip(s) and a method of fabricating the semiconductor chip package substrate, and a semiconductor device wherein a semiconductor chip(s) is mounted on the semiconductor chip package substrate, those of which enable to reduce the size, increase the reliability, reduce the cost, and make the standardization of design and fabricating process easier.

Next, other embodiments of the semiconductor device, the substrate and the fabricating method of the present invention are now explained with reference to FIGS. 10–16.

The semiconductor device of the present embodiment is fabricated by forming cavity portions at parts of a wiring substrate and mounting semiconductor chips in the cavity portions. In the semiconductor device, continuous wiring conductors are buried in a surface layer of the wiring substrate, which includes surfaces of the cavity portions.

Figure 10:
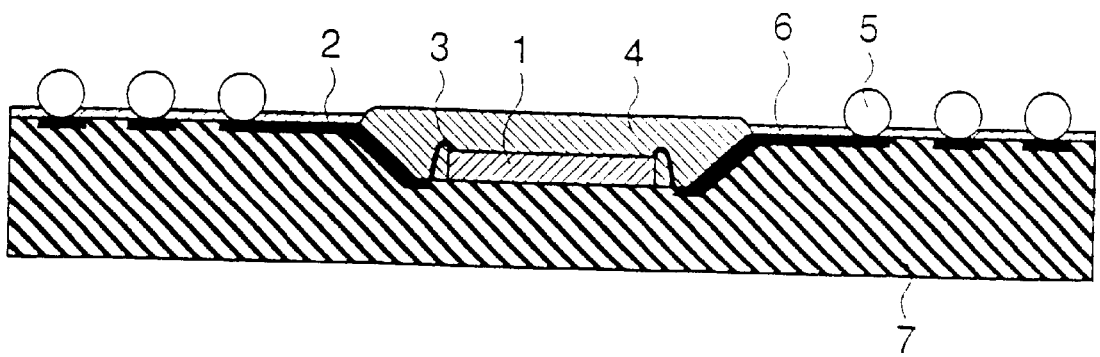
FIG. 10 is a cross sectional view showing other example of the semiconductor device according to the present invention.

Concretely, as shown in FIG. 10, for example, the wiring substrate having two or more than two surface layers with different heights is formed by providing an external connection terminal portion connecting to the external connection terminal 5 in the first surface layer, providing an inner connection terminal portion connecting to the semiconductor chip 1 on the second surface layer, providing a ramp with a height not less than 0.05 mm between the first and second layers, and burying the continuous wiring conductors on the first surface layer, the second surface layers and surface layers in between.

The wiring substrate may be embodied by the fabricating method wherein the wiring conductor is formed on a metal foil such as copper or the like, and the metal foil is adhered to the plastic layer at the same time the cavity portion is formed.

The wiring substrate may be also embodied by a fabricating method of the wiring substrate with the cavity portion by pressing a pile of glass fabrics impregnating the plastic and the metal foil comprising the wiring conductor, wherein parts of the glass fabrics corresponding to the cavity portions are removed prior to the pressing process.

Figure 11:
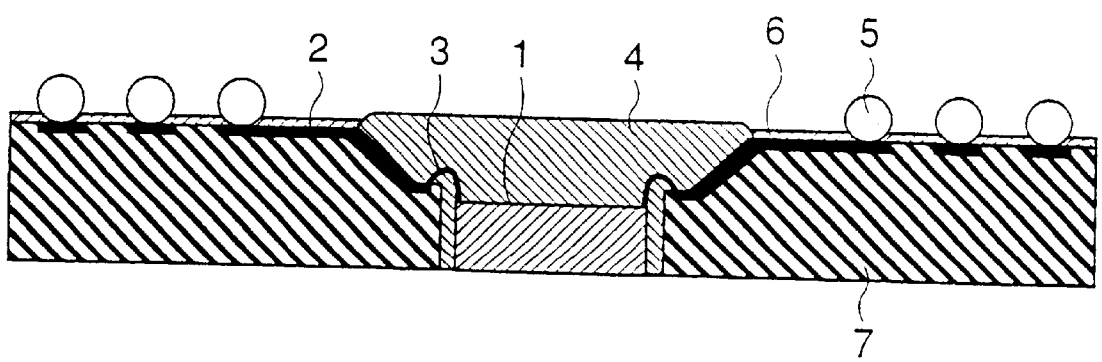
FIG. 11 is a cross sectional view showing other example of the semiconductor device according to the present invention.

In another example of the present embodiment of the wiring substrate with the cavity portion, the wiring substrate and its fabricating method, wherein the cavity portion is formed into two step sections, one for the wire bonding portion and the other for the chip adhesion portion, are provided as shown in FIG. 11, for example. In a method for forming the two step cavity portion, the first cavity step is fabricated by press forming the prepregs using a die with a projected portion, and the second cavity step by the milling.

The semiconductor device may be fabricated by forming a plurality of the cavity portions on single wiring substrate, adhering chips on each cavity, sealing with the plastic, attaching the solder balls, and dicing to separate each device.

FIGS. 10–13 are cross sectional figures showing typical semiconductor devices in the present embodiment.

Numeral 1 in the figures indicates the semiconductor chip, 2 indicates the wiring, 3 indicates the wire, 4 indicates the plastic sealant, 5 indicates the external terminal electrode, 6 indicates the surface insulation layer, 7 indicates the insulation substrate, 8 indicates the metal plate, and 9 indicates the insulation plate.

Figure 12:
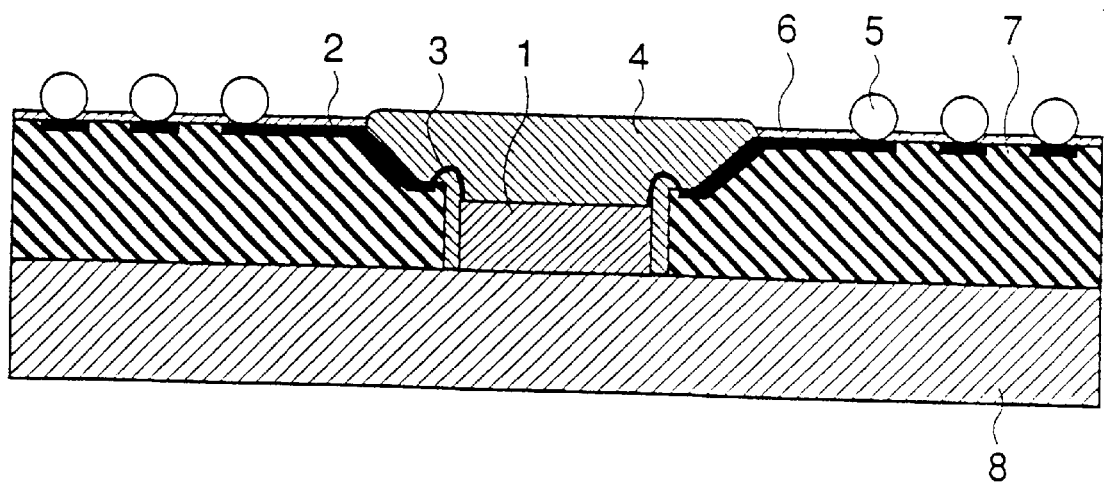
FIG. 12 is a cross sectional view showing other example of the semiconductor device according to the present invention.
Figure 13:
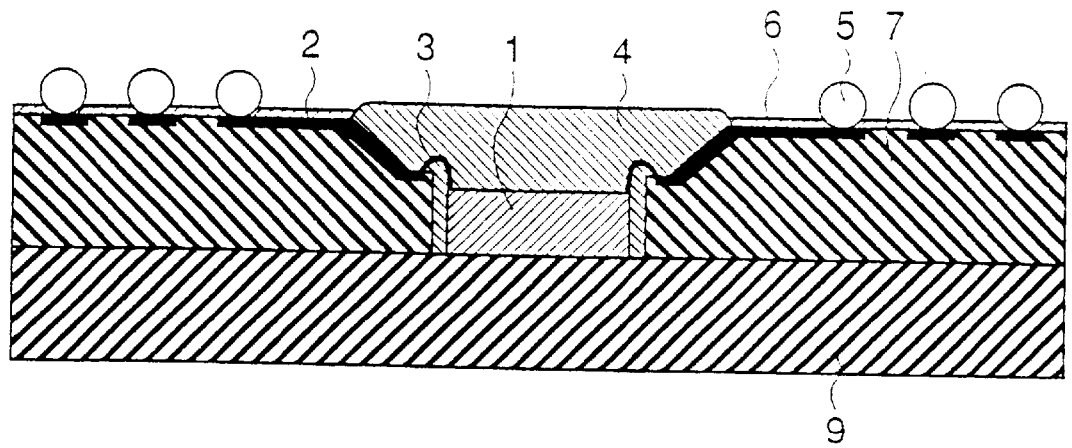
FIG. 13 is a cross sectional view showing other example of the semiconductor device according to the present invention.

A part of the cavity portion shown in FIG. 11 may comprises a through hole. As shown in FIGS. 12, 13, the metal plate 8, the insulation plate 9 may be used as a support at the bottom side of the semiconductor device.

An example of the fabricating method of the semiconductor device in the present embodiment will now be explained with reference to FIG. 14.

A three layer structure foil, formed by plating a 0.5 μm thick nickel layer 11 over a 35 μm copper foil 10 (carrier foil fabricated by NIHON DENKAI Co.) and further forming a 5 μm copper layer, is prepared. The copper layer with 5 μm thickness is etched after forming a resist pattern with a conventional photo-resist method so as to form the wiring conductor 12.

The etching solution is required to have a selectivity for etching only copper and not nickel. Alkali etchants which are widely used in the print board industry are preferred. The carrier layer with 35 μm thickness is protected by the resist from being etched.

Figure 14:
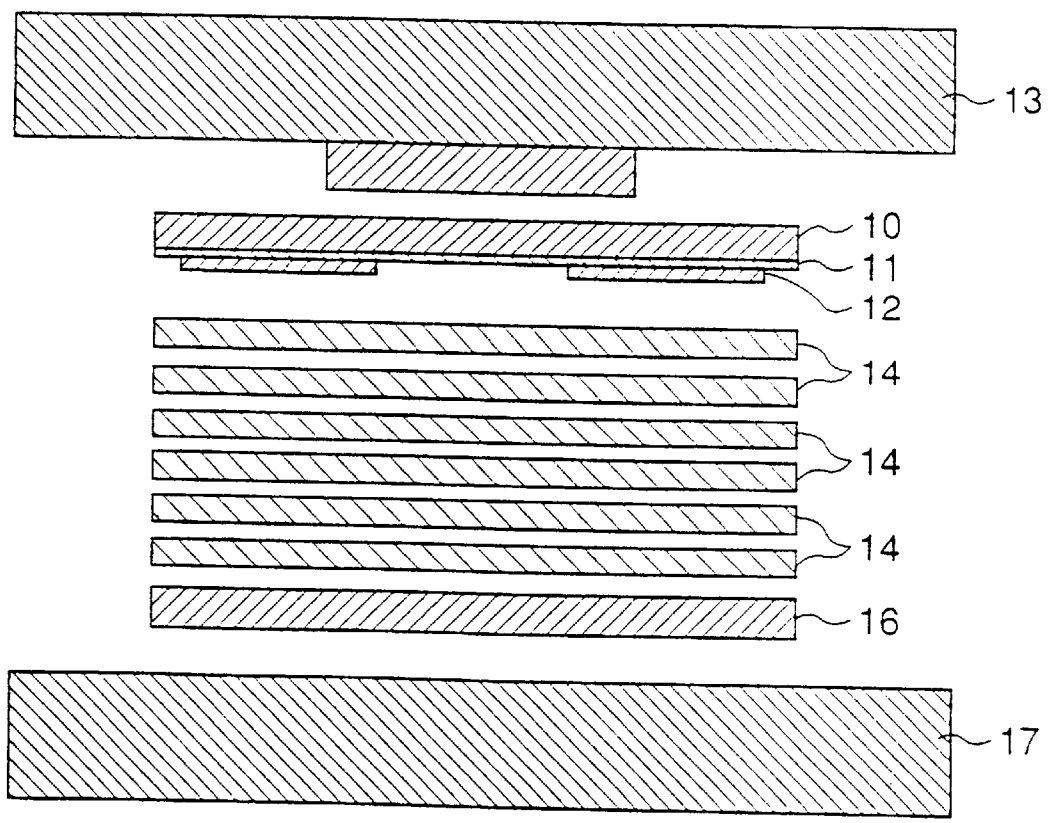
FIG. 14 is a cross sectional view showing other example of the fabricating method (press configuration) of the semiconductor device according to the present invention.

The copper foils with the pattern (wiring conductor 12) are heat pressed in the arrangement shown in FIG. 14 for two hours at a temperature of 180° C. and a pressure of 25 kg/cm². A projected portion of the die 13 has a height of 0.15 mm with a slant angle of 90°. Sheets of teflon (Dupont Co.) with a thickness of 50 μm, which is not shown in the figure, are placed in between the dies 13, 17 and copper foils 10, 16 to provide cushion layers during the press shaping process.

Prepregs (without holes), which are fabricated by Hitachi Chemical Co., Ltd. by impregnating heat resist epoxy into glass fabric are used.

A glass epoxy substrate fabricated by the conditions described above contains a plurality of units each comprising the same wiring and the cavity portion. The carrier copper foil of the glass epoxy substrate is etched by the alkali etchant described above to remove the carrier copper foil from the whole surface area.

Next, the nickel layer is etched away by an etching solution for selectively etching nickel. According to the above mentioned conditions, the cavity portions of 0.15 mm depth are formed in the substrate with 1 mm thickness, and the continuous wiring is disposed on the surface layer including surface planes of the cavity portions. The substrate is milled further by a milling machine up to 0.5 mm depth for mounting the semiconductor chips 1, and diced to separate each unit. The semiconductor chip 1 is adhered in the cavity portion, and connected by the wire bonding. The semiconductor chip 1 and the wire bonding portion are sealed with liquefied plastic sealant to complete the semiconductor device.

Another example of the fabricating method of the semiconductor device in the present embodiment will now be explained with reference to FIG. 15.

Figure 15:
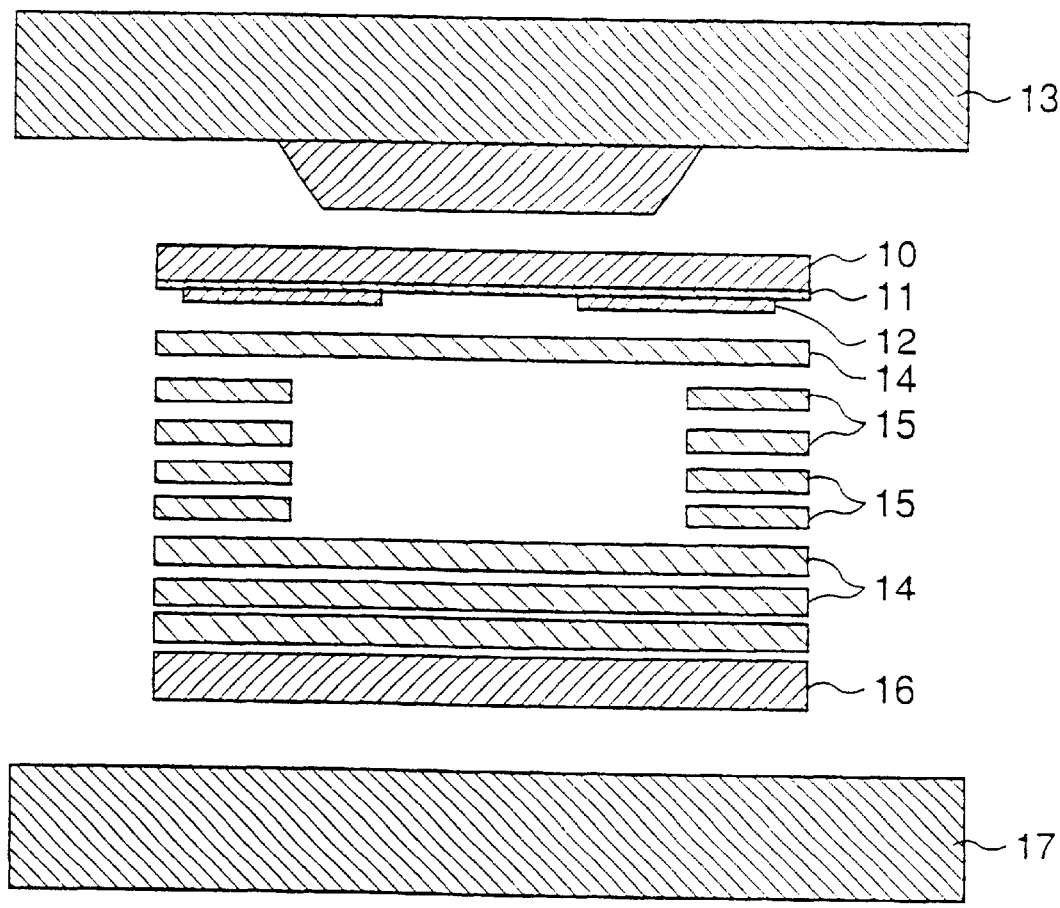
FIG. 15 is a cross sectional view showing other example of the fabricating method (press configuration) of the semiconductor device according to the present invention.

A patterned copper foil 10 with the similar construction as that of the example shown in FIG. 14 is heat pressed in the arrangement shown in FIG. 15 for two hours at a temperature of 180° C. and a pressure of 25 kg/cm². In the instant example, a projected portion of the die 13 has been fabricated to have a height of 0.5 mm with a slant angle of 45°.

Sheets of teflon (Dupont Co.) with a thickness of 50 μm, which is not shown in the figure, are placed in between the die/die 13, 17 and copper foils 10, 16 as cushion layers during the press shaping process.

Prepregs 14 fabricated by Hitachi Chemical Co., Ltd. by impregnating heat resist epoxy into glass fabric are used. The prepregs 15 are hollowed out at positions corresponding to the projected portion of the die 13, and piled so many layers as to make the total thickness of the hollowed-out prepregs comparable to the height of the projected portion.

In the instant example, five pieces of the hollowed-out prepregs 15 with 0.1 mm thickness and five pieces of the prepregs 14 without a hole are used for the projected portion of 0.5 mm height. A glass epoxy substrate fabricated by the conditions described above contains a plurality of units each comprising the same wiring and the cavity portion. The carrier copper foil of the glass epoxy substrate is etched by the alkali etchant described above to remove the carrier copper foil from the whole surface area, and then the nickel layer is etched away by an etching solution which selectively etches nickel.

According to the above mentioned conditions, the cavity portions of 0.5 mm depth are formed in the substrate with 1 mm thickness, and the continuous wiring is disposed at the surface layer including surface planes of the cavity portion. The semiconductor chips 1 are adhered in the cavity portions, and connected by the wire bonding. The semiconductor chip 1 and the wire bonding portion are sealed with liquefied plastic sealant. After solder balls 5 are attached, the substrate is diced and separated by each device unit to complete the fabrication of the semiconductor device.

Another example of the fabricating method of the semiconductor device in the present embodiment will now be explained with reference to FIG. 16.

Figure 16:
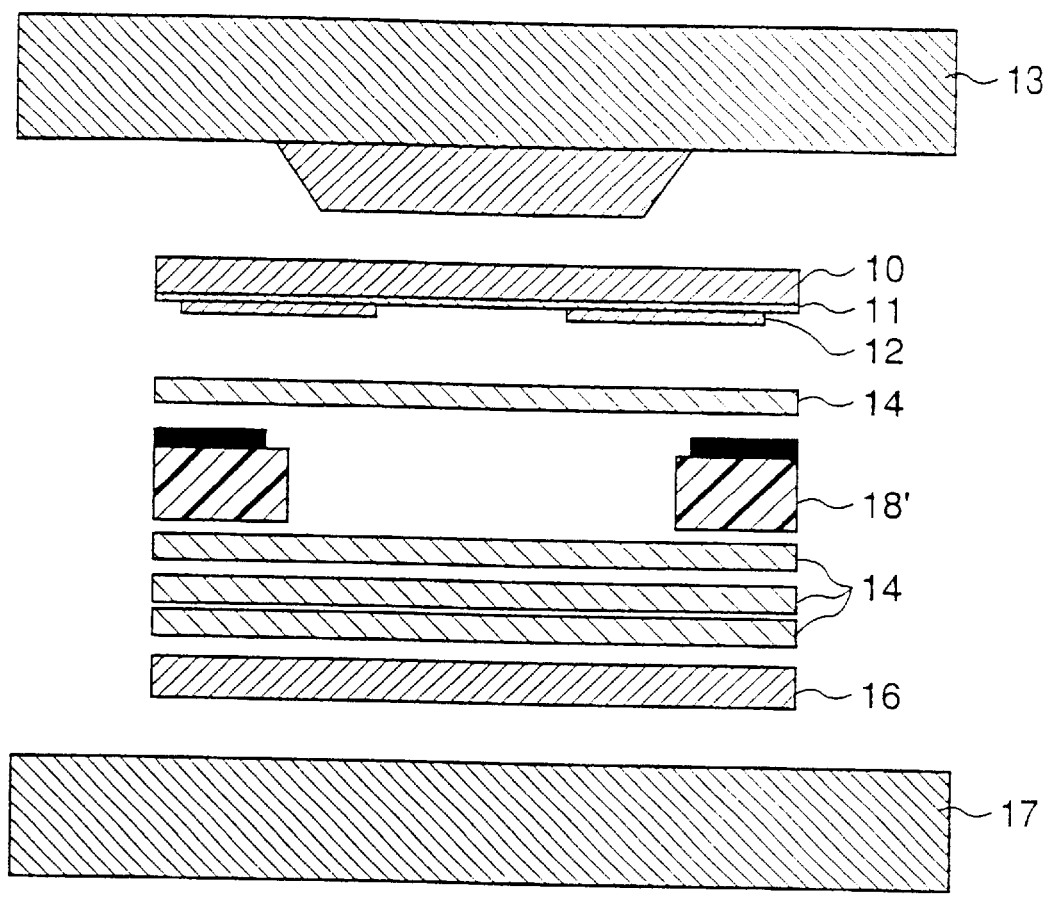
FIG. 16 is a cross sectional view showing other example of the fabricating method (press configuration) of the semiconductor device according to the present invention.

A patterned copper foil 10 with the similar construction as that of the example shown in FIG. 14 is heat pressed in the arrangement shown in FIG. 16 for two hours at a temperature of 180° C. and a pressure of 25 kg/cm². A projected portion of the die 13 has been fabricated to have a height of 0.5 mm with a slant angle of 45°. Sheets of teflon (Dupont Co.) with a thickness of 50 μm, which is not shown in the figure, are placed in between the dies 13, 17 and copper foils 10, 16 to provide cushion layers during the press shaping process. Prepregs fabricated by Hitachi Chemical Co., Ltd. by impregnating heat resist epoxy into glass fabric are used.

A glass epoxy substrate 18' with 0.5 mm thickness is hollowed out at position corresponding to the projected portion of the die 13. In the instant example, a piece of the prepreg 14 of 0.1 mm thickness without a hole is placed in between the glass epoxy substrate 18' and the patterned copper foils 10, and three pieces of the prepregs 14 are placed the lower side of the glass epoxy substrate 18'.

The glass epoxy substrate fabricated by the conditions described above contains a plurality of device units, each comprising the same wiring and the same cavity portion. The carrier copper foil of the glass epoxy substrate is etched by the alkali etchant described above to remove the carrier copper foil from the whole surface area, and then the nickel layer is etched away by an etching solution for selectively etching nickel.

According to the above mentioned conditions, cavity portions of 0.5 mm depth are formed in the substrate with 1 mm thickness, and the continuous wiring is disposed at the surface layer including surface planes of the cavity portions. The semiconductor chips 1 are adhered in the cavity portions, and connected by the wire bonding. The semiconductor chip 1 and the wire bonding portion are sealed with liquefied plastic sealant. After solder balls 5 are attached, the substrate is diced and separated into each units to complete the semiconductor device.

According to the present embodiment, the semiconductor device may be provided with a simple structure, and fabricated utilizing simpler fabricating process of lower cost.

Next, other embodiments of the semiconductor device, the substrate and the fabricating method of the present invention are now explained with reference to FIGS. 17–20.

Figure 17:
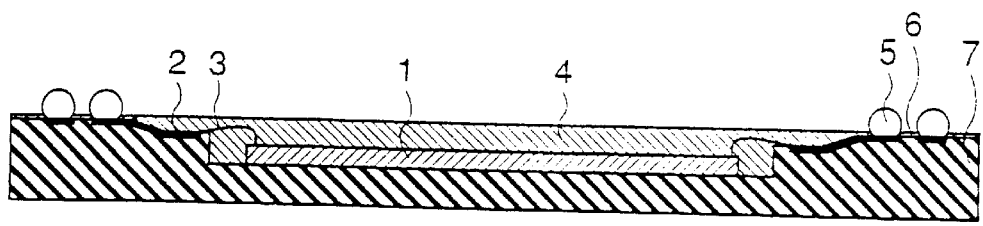
FIG. 17 is a cross sectional view showing other example of the semiconductor device according to the present invention.

As shown in FIG. 17, the semiconductor device of the present embodiment is provided with a semiconductor chip 1, an insulator substrate 7 having a semiconductor chip mount portion for mounting the semiconductor chip 1, external electrodes 5 formed at an surface of the insulation substrate 7 and electrically connected to the semiconductor chip 1 for making connections to outside when the semiconductor chip 1 was mounted, plastic sealant 4 for sealing the semiconductor mounting portion in which the semiconductor chip 1 had been mounted. Furthermore, the semiconductor device of the present embodiment is provided with ramps between wire 3 for connecting to the semiconductor chip 1 and the external electrode 5, and wiring 2 disposed along slope portion of the ramp connecting in between. A numeral 6 in the figure indicates a surface insulation layer formed at a surface of the insulation substrate 7.

The semiconductor chip mount portion of the semiconductor device of the present embodiment is fabricated by further hollowing out a base surface of a cavity portion of the semiconductor device package substrate, which is fabricated by a fabricating method which will be explained in the following section with reference to FIG. 20, for example.

A slant angle of side surfaces of the cavity portion is less than 45°. The slant angle may be determined in accordance with a slant angle of the projected portion of the die for the press forming, or a balance between a rigidity of a transfer copper foil (carrier layer) 10 and a pressure during the press forming.

Figure 18:
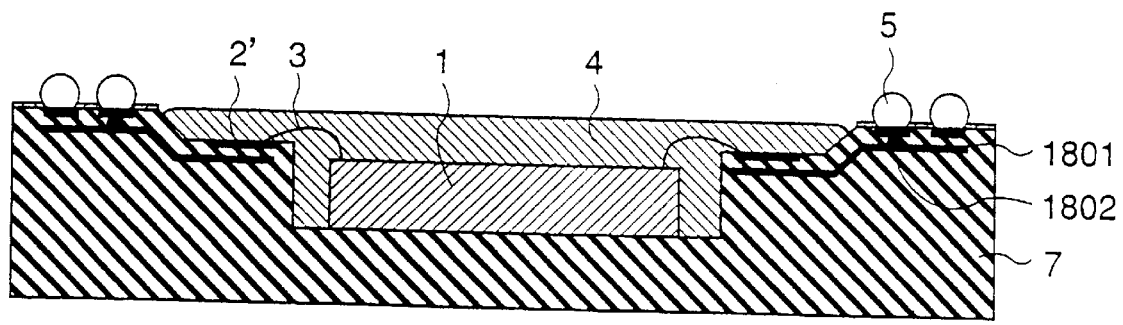
FIG. 18 is a cross sectional view showing other example of the semiconductor device according to the present invention.

The semiconductor device of the present embodiment is not limited to an example shown in FIG. 17. The semiconductor device may be provided with a multiple layer structure as shown in FIG. 18, wherein the wiring 2 is disposed in the bottom surface of the cavity portion instead of its side walls, and a ground layer 1801 is provided below the wiring 2 while having an insulation layer in between. Furthermore, the semiconductor device may be provided with interlayer connection portions 1802 for connecting the ground layer 1801 and the external electrodes 5.

In the present embodiment, a method for forming the ground layer 1801 and a method for interconnecting the layers are not limited to any particular arts. For example, the multiple layer structure of the substrate may be formed by placing a copper foil or a copper pattern which forms the ground layer 1801 at a position facing to the wiring substrate, placing insulation adhesive sheets such as prepregs in between them, piling up the prepregs further, and press forming them altogether.

An example of the fabricating method of the semiconductor chip package substrate in the present embodiment will now be explained with reference to FIGS. 19, 20.

Basic structure of the fabricating method of the present embodiment is the same as that of two previous embodiments of the fabricating methods. In the following explanation, only parts of the fabricating method different from the previous embodiments will be explained, and detail explanations regarding the similar parts will be omitted.

A three layer structure foil comprising a 25 $\mu$m thick copper foil 10 (carrier layer), a copper layer 12 which will comprises the wiring layer, and a barrier layer 11 placed between the carrier layer 10 and the copper layer 12, is used as a transfer metal foil for forming the wiring 2 in the instant example of the fabricating method of the present embodiment, as the same way as in two previous embodiments. The two layers 11, 12 are shown together in the figure.

As shown in FIG. 19, the copper foil with the pattern 10–12 is heat pressed between top boards 1902 and heat boards 1901 at a temperature of 190° C. with a pressure of 30 kg/cm. A piece of aluminum foil 18, the patterned copper foil of the three layer structure 10–12, a plurality of prepregs 1905, 1906, and a copper foil 16 with a thickness of 35 $\mu$m are arrayed from top to bottom of the figure between the upper die 13 and the lower die 17.

A projected portion of the upper die 13 has a trapezoidal cross sectional shape and slant side surfaces with a slant angle of 30°. The prepreg 1906 has a through hole at a position corresponding to the projected portion of the die 13, and is placed below the first prepreg 1905.

The fabricating method of the present embodiment is not limited to only the example shown in FIG. 19, but also an arrangement shown in FIG. 20 may be used.

Namely, the copper foil with the pattern 10–12 is heat pressed between top boards 1902 and heat boards 1901 at a temperature of 190° C. with a pressure of 20 kg/cm². Three pieces of aluminum foils 18, the patterned copper foil of the three layer structure 10–12 including the a 35 $\mu$m copper foil 10, a piece of prepreg 1906 with a through hole, a plurality of prepregs 1905, 1906, and a copper foil 16 with a thickness of 35 $\mu$m are arrayed between the upper die 13 and the lower die 17 from top to bottom of the figure, the die 13 having a projected portion with side surfaces of a slant angle of 45°.

According to the fabricating method shown in FIG. 20, the semiconductor device may be provided with the cavity portion with side walls of a lesser slant angle as shown in FIG. 17.

Figure 21A:
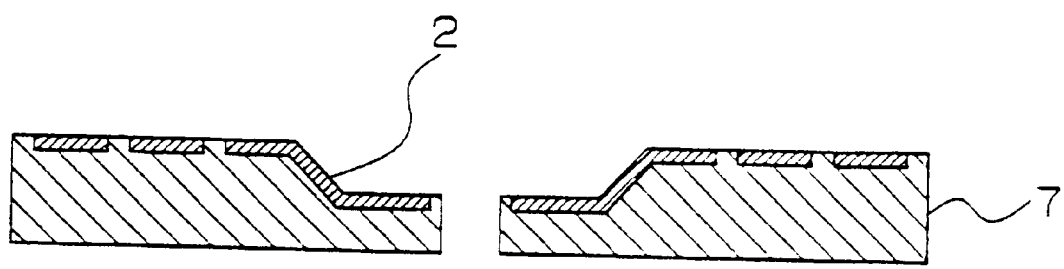
FIG. 21A is a cross sectional view showing other example of the semiconductor chip package substrate according to the present invention.
Figure 21B:
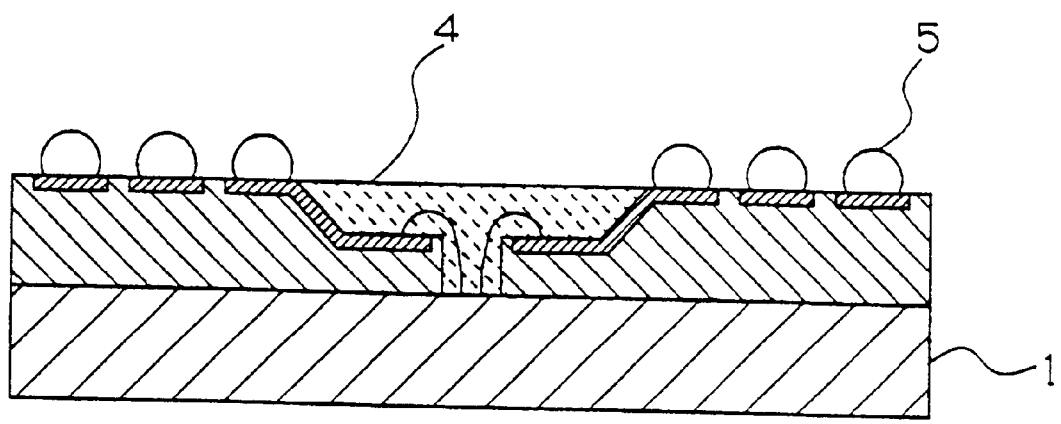
FIG. 21B is a cross sectional view showing other example of the semiconductor device according to the present invention.

The semiconductor chip package substrate of the present invention may be a semiconductor chip package substrate with a cavity portion as shown in FIG. 21A or FIG. 21B comprising wiring disposed along the top surface of the substrate and wall surfaces of the cavity portion, wherein the wiring comprises an external connection terminal portion for connecting external connection terminals formed on a surface of the substrate at an opening side of the cavity portion, an internal connection terminal portion for connecting to the mounted semiconductor chip, and a wiring portion disposed between the external connection terminal portion and the internal connection terminal portion. Furthermore, the wiring is disposed on the substrate surface and wall surfaces of the cavity portion, and the internal connection terminal portion is disposed inside of the cavity portion.

Figure 22A:
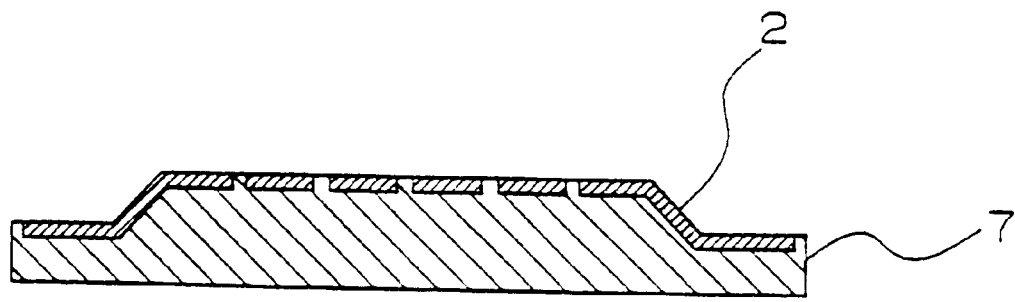
FIG. 22A is a cross sectional view showing other example of the semiconductor chip package substrate according to the present invention.
Figure 22B:
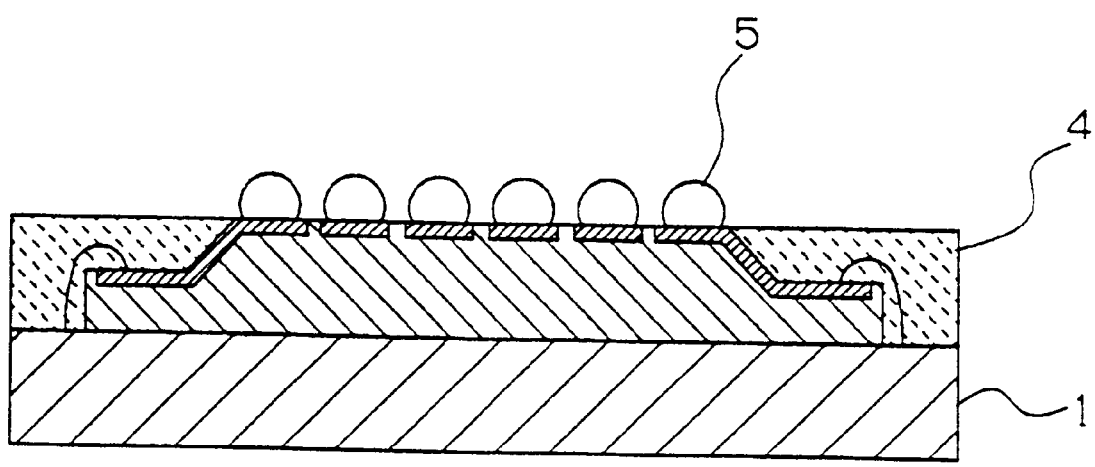
FIG. 22B is a cross sectional view showing other example of the semiconductor device according to the present invention.

In FIG. 21A, FIG. 22B, numeral 7 indicates the insulation substrate, numeral 2 indicates the wiring buried in the substrate surface and the wall surfaces of the cavity portion. A through hole at the center of the cavity portion is formed in the semiconductor chip package substrate of FIG. 21A. FIG. 21B shows a semiconductor device utilizing the semiconductor chip package substrate. In FIG. 21B, numeral 1 indicates the semiconductor chip which is adhesive-mounted on the substrate, numeral 4 indicates plastic sealant, numeral 5 indicates the external connection terminals. The cavity portion of the substrate, in which the internal connection terminal portion of the wiring is formed, is sealed by the plastic. The substrate may be fabricated by the fabricating method described above.

The semiconductor chip package substrate of FIG. 22A has cavity portions formed at both edges, which can be fabricated by forming a plurality of device units, each of which corresponds to the semiconductor device, on the substrate described above, and by dicing at the cavity portions to separate the each unit. The semiconductor device utilizing such a substrate is shown in FIG. 22B. In FIG. 22B, numeral 1 indicates the semiconductor chip which is adhesive-mounted on the substrate, numeral 4 indicates plastic sealant, numeral 5 indicates the external connection terminal. The cavity portions at the both edges, in which the internal connection terminal portions of the wiring are formed, are sealed with the plastic.

According to the present invention, the semiconductor chip package substrate with a plurality of the units may be fabricated by single press forming process.

Figure 23:
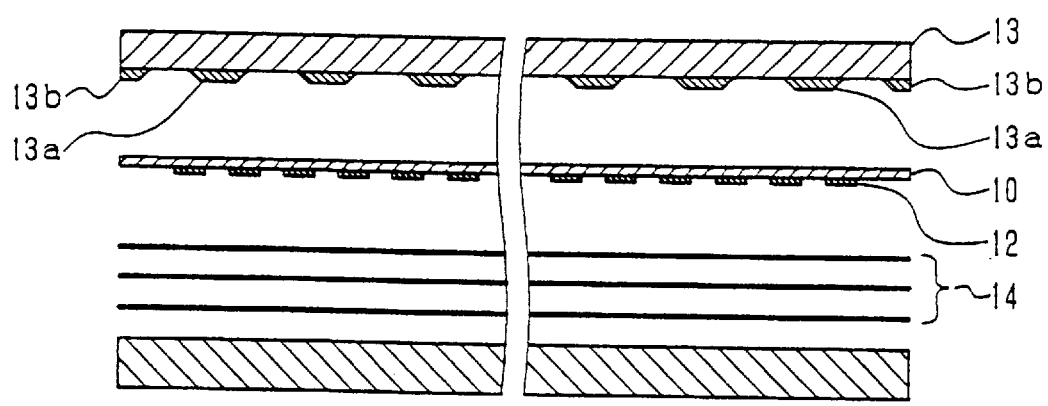
FIG. 23 is a cross sectional view showing other example of the fabricating method (press configuration) of the semiconductor device according to the present invention.

FIG. 23 shows a cross sectional view of a arrangement of the press forming for fabricating the semiconductor chip package substrate with a plurality of the device units. Numeral 13 indicates the die provided with a plurality of the projected portions 13a, numeral 17 indicates the lower die, numeral 10 indicates a copper foil in which a plural sets of the wiring are formed, and numeral 14 indicates prepregs.

A plurality of the cavity portions and the wiring 12, which is continuously buried into the substrate surfaces from the external connection terminal portion to the internal connection terminal portion in the cavity portion via the wall surfaces of the cavity portion, are formed by single press forming process utilizing a plurality of the projected portions 13a, which are arrayed and evenly separated from each other in longitudinal and lateral directions. According to the instant example, the external connection terminal portion on the substrate surface may precisely keep its position on the surface plane, at where the external connection terminal portion receives equal tensile forces generated during the formation of neighboring cavity portions, during the press forming process (high dimension stability). Namely, the formation of the multiple device units on the semiconductor chip package substrate of the present invention enables to form the cavity portion without causing any shifts from the designed position of the external connection terminal portion on the surface plane, which is set prior to the press forming process. An alignment process for forming the solder resist at areas other than locations, where external connection terminals of the external connection terminal portion are to be formed, becomes easier when the position of the external connection terminal portion on the substrate surface is kept the same as before the press forming process. In the outermost area, dummy projected portions 13b may be disposed along circumference of the die 13. According to the dummy projected portion 13b, the positional shift of the external connection terminal portions disposed at the outermost area of the substrate, and flows of plastic of the prepregs may be prevented. A number of the multiple device units on the substrate is preferred to be not less than 7×7.

According to the present invention, the semiconductor device may be fabricated by the steps comprising; a step for preparing the press forming assembly including the upper die with a plurality of the projected portions arrayed evenly in longitudinal and lateral directions, the wiring construction body comprising wiring positioned in correspondence to the projected portions and the carrier metal foil, prepregs, and the lower die; a step for pressing the assembly in between the upper and the lower dies to form a plurality of cavity portions on the substrate consisting of the pressed prepregs, and to bury the wiring into a surface of the substrate and wall surfaces of the substrate in the cavity portion in single process; a step for removing the carrier metal foil; a step for mounting the semiconductor chip; a step for sealing the cavity portions with plastic; a step for forming the external connection terminals; and a step for dicing and separating into each device unit.

What is claimed is:

1. A semiconductor device fabricated by forming at least one cavity portion on a semiconductor chip package substrate, mounting at least one semiconductor chip in said cavity portion, and sealing with plastic sealant, wherein:

said semiconductor chip package substrate comprises wiring disposed along surface of said substrate and wall surfaces of said substrate in said cavity portion, said wiring comprises an external connection terminal portion for connecting to external connection terminals which are provided on the surface of said substrate at a side of said cavity portion's opening, an internal connection terminal portion for connecting to the mounted semiconductor chip, and a wiring portion disposed in between said external connection terminal portion and said internal connection terminal portion, said wiring portion is buried in a surface of said substrate and one of said wall surfaces of said substrate in said cavity portion, and said internal connection terminal portion is disposed inside of said cavity portion.

2. A semiconductor device in accordance with claim 1, wherein:

said wall surface of said substrate in said cavity portion is extended toward the bottom surface of said cavity portion with a slant angle which is set within a predetermined angle range.

3. A semiconductor device in accordance with claim 2, wherein:

said slant angle of said wall surface of said substrate in said cavity portion is in a range of 5°–40°.

4. A semiconductor device in accordance with claim 2, wherein:

a ratio L/G is within a range of 1.5<L/G<10, where G is a height of said slant structure of said wall surface of said substrate in said cavity portion, and L is its horizontal dimension.

5. A semiconductor device in accordance with claim 1, wherein:

said cavity portion is formed by a press forming process utilizing a press pattern with a projected portion.

6. A semiconductor device in accordance with claim 1, wherein:

said cavity portion is formed into a multiple step structure.

7. A semiconductor device in accordance with claim 5, wherein:

said cavity portion is provided with a semiconductor chip mount portion for mounting semiconductor chip which is formed by hollowing out said cavity portion further.

8. A semiconductor device in accordance with claim 7, wherein:

a depth of said semiconductor chip mount portion which has been hollowed out is larger than a thickness of a semiconductor chip to be mounted therein.

9. A semiconductor device in accordance with claim 1, wherein:

a height of a ramp between said external connection terminal portion disposed on said substrate surface and said internal connection terminal portion disposed inside of the cavity portion is not less than 0.05 mm.

10. A semiconductor device in accordance with claim 1, wherein:

terminals of the semiconductor chip mounted inside of said cavity portion and said internal connection terminal portions are wire-bonded.

11. A semiconductor device in accordance with claim 1, wherein:

terminals of the semiconductor chip are directly connected by a face-down bonding.

12. A semiconductor device in accordance with claim 1, wherein:

said wiring is disposed in an area of said wall surface which does not include any of corner sections of said cavity portion.

13. A semiconductor device in accordance with claim 1, wherein:

said cavity portion is formed substantially at the center of the major surface plane of said substrate, and the semiconductor chip is mounted inside of said cavity portion so as the semiconductor chip to be positioned substantially at the center of a dimension of the thickness of said semiconductor chip package substrate.

14. A semiconductor device in accordance with claim 1, wherein:

the semiconductor chip is offset-mounted in said cavity portion with an offset amount of not bigger than 30% of said substrate thickness from the center position of said substrate's thickness along a direction of the thickness.

15. A semiconductor device in accordance with claim 1, wherein:

said cavity portion has a size large enough to mount a plurality of device elements on its bottom surface area, and is provided with a plurality of wiring sets to said plurality of device elements, and a plurality of semiconductor chips and passive device elements are mounted in said cavity portion.

16. A semiconductor device in accordance with claim 1, wherein:
    said wiring is formed by utilizing a squeeze shapeable wiring construction body consisting of only metals, and said squeeze shapeable wiring construction body has a multiple layer structure including at least the first metal layer for constructing said wiring and the second metal layer which functions as a carrier layer.

17. A semiconductor chip package substrate provided with at least one cavity portion for mounting at least one semiconductor chip, comprising:
    wiring disposed along a surface of said substrate and a wall surface of said substrate in said cavity portion wherein:
    said wiring comprises an external connection terminal portion for connecting to external connection terminals which are provided on the surface of said substrate at a side of said cavity portion's opening, an internal connection terminal portion for connecting to the mounted semiconductor chip, and a wiring portion disposed in between said external connection terminal portion and said internal connection terminal portion,
    said wiring portion is buried in a surface of said substrate and one of said wall surfaces of said substrate in said cavity portion, and
    said internal connection terminal portion is disposed inside of said cavity portion.

18. A semiconductor chip package substrate in accordance with claim 17, wherein:
    a depth of said cavity portion is less than a thickness of the semiconductor chip to be mounted, and
    said cavity portion is hollowed out at the bottom surface of said cavity portion from the center portion along a direction of a thickness of said semiconductor chip package substrate up to a depth within a range of 0.5–2.5 times a thickness of the semiconductor chip to be mounted.

19. A semiconductor chip package substrate in accordance with claim 17, wherein:
    a depth of said cavity portion is less than a thickness of the semiconductor chip to be mounted, and said cavity portion is hollowed out at the bottom surface of said cavity portion, and
    said semiconductor chip package substrate further comprises a plastic layer formed by hardening prepregs so as to have an exposed hollowed-out bottom surface at least consisting of nonwoven fabrics.

20. A semiconductor chip package substrate in accordance with claim 17, further comprising:
    a metal plate adhered to the reverse side surface of a plastic layer at which said cavity portion is formed.

21. A fabricating method of a semiconductor chip package substrate, comprising the steps of:
    pressing to adhere a squeeze shapeable wiring construction body to a plastic substrate, said wiring construction body consisting of all metals and having a multiple layer structure comprising at least the first metal layer and the second metal layer which functions as a carrier layer, while shaping said plastic substrate so as to form a cavity portion therein with its wall surfaces having inclination angles within a predetermined range; and
    removing the metal layers except the first layer, wherein:
    said wiring, which is buried in the substrate surface and wall surface of said substrate in said cavity portion, is formed and disposed along said substrate surface and said wall surface of said substrate in said cavity portion; and
    said wiring comprising an external connection terminal portion for connecting to external connection terminals disposed on a surface of said substrate on a side of said cavity opening, an inner connection terminal portion for connecting to a semiconductor chip to be mounted, and a wiring portion in between said external connection terminal portion and said inner connection terminal portion.

22. A fabricating method of a semiconductor chip package substrate in accordance with claim 21, wherein:
    a percentage elongation after fracture of said squeeze shapeable wiring construction body is not less than 2%.

23. A fabricating method of a semiconductor chip package substrate in accordance with claim 21, wherein:
    a thickness of said carrier layer composing said squeeze shapeable wiring construction body is within a range of 0.010–0.050 mm.

24. A fabricating method of a semiconductor chip package substrate in accordance with claim 21, wherein:
    a slant angle range of said wall surface of said substrate in said cavity portion is from 5° to 40°, and
    a depth of said cavity portion is at least not less than 30% of a thickness of a semiconductor chip to be mounted.

25. A fabricating method of a semiconductor chip package substrate comprising at least one cavity portion for mounting at least one semiconductor chip and at least one set of wiring, wherein:
    said cavity portion has a depth of less than a thickness of a semiconductor chip to be mounted, and is hollowed out at the bottom surface of said cavity portion, and
    said wiring to the semiconductor chip mounted is cut during the hollow-out process, and the cut edge portion of said wiring reaches a fringe portion of a cavity portion formed by the hollow-out process.

26. A fabricating method of a semiconductor chip package substrate in accordance with claim 21, wherein:
    a hollow out process is conducted at the bottom surface of said cavity portion after said cavity portion is formed, and
    said removing process of the metal layers except the first layer is conducted after said hollow-out process.

27. A semiconductor chip package substrate in accordance with claim 17, wherein:
    said wall surface of said substrate in said cavity portion extends toward the bottom surface of said cavity portion, and has a slant angle within a predetermined range.

28. A semiconductor chip package substrate in accordance with claim 27, wherein:
    said slant angle of said wall surface of said substrate in said cavity portion is in a range of 5°–40°.

29. A semiconductor chip package substrate in accordance with claim 27, wherein:
    a ratio L/G is within a range of 1.5<L/G<10, where G is a height of said slant structure of said wall surface of said substrate in said cavity portion, and L is its horizontal dimension.

30. A semiconductor chip package substrate in accordance with claim 17, wherein:
    said cavity portion is formed by a press forming process utilizing a press pattern with a projected portion.

31. A semiconductor chip package substrate in accordance with claim 17, wherein:
    said cavity portion is formed into a multiple step structure.

32. A semiconductor chip package substrate in accordance with claim 30, wherein:

said cavity portion is provided with a semiconductor chip mount portion for mounting semiconductor chip which is formed by hollowing out said cavity portion further.

33. A semiconductor chip package substrate in accordance with claim 32, wherein:

a depth of said semiconductor chip mount portion which has been hollowed out is larger than a thickness of a semiconductor chip to be mounted therein.

34. A semiconductor chip package substrate in accordance with claim 17, wherein:

a height of a ramp between said external connection terminal portion disposed on said substrate surface and said internal connection terminal portion disposed inside of the cavity portion is not less than 0.05 mm.

35. A fabricating method of a semiconductor device, comprising steps of:

preparing a press forming assembly including the upper die with a plurality of the projected portions arrayed evenly in longitudinal and lateral directions, a wiring construction body comprising a plurality of wiring sets positioned in correspondence with the projected portions and a carrier metal foil, prepregs, and the lower die;

pressing the press forming assembly in between the upper and the lower dies to form a plurality of cavity portions on said substrate consisting of said pressed prepregs, and to bury said wiring into a surface of said substrate and wall surfaces of said substrate in said cavity portions in single process;

removing said carrier metal foil;

mounting the semiconductor chips;

sealing said cavity portions with plastic;

forming external connection terminals; and dicing and separating into each device unit.

36. A fabricating method of a semiconductor device in accordance with claim 35, wherein:

said upper die is provided with a plurality of dummy projected portions along its circumference.

37. A semiconductor chip package substrate with at least one cavity portion, comprising:

wiring disposed along a surface of said substrate and a wall surface of said substrate in said cavity portion, wherein:

said wiring comprises an external connection terminal portion for connecting to external connection terminals which are provided on the surface of said substrate at a side of said cavity portion's opening, an internal connection terminal portion for connecting to the mounted semiconductor chip, and a wiring portion disposed in between said external connection terminal portion and said internal connection terminal portion;

said wiring portion is buried in a surface of said substrate and said wall surface of said substrate in said cavity portion; and said internal connection terminal portion is disposed inside of said cavity portion.

* * * * *